(12) United States Patent
Nitadori

(10) Patent No.: US 9,214,371 B2
(45) Date of Patent: Dec. 15, 2015

(54) THERMAL TREATMENT APPARATUS AND THERMAL TREATMENT METHOD

(75) Inventor: Hiromi Nitadori, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 424 days.

(21) Appl. No.: 13/368,442

(22) Filed: Feb. 8, 2012

(65) Prior Publication Data

US 2012/0270170 A1 Oct. 25, 2012

(30) Foreign Application Priority Data

Feb. 10, 2011 (JP) ................................. 2011-027664

(51) Int. Cl.
*F27D 15/02* (2006.01)
*H01L 21/677* (2006.01)
*H01L 21/67* (2006.01)
*F27D 5/00* (2006.01)
*F27D 1/18* (2006.01)

(52) U.S. Cl.
CPC .... *H01L 21/67757* (2013.01); *H01L 21/67017* (2013.01)

(58) Field of Classification Search
CPC ................................................. H01L 21/67757
USPC ........ 432/77, 86, 239, 242, 247, 258; 34/194, 34/195; 438/660, 663, 715, 758
See application file for complete search history.

(56) References Cited

U.S. PATENT DOCUMENTS

| | | | | |
|---|---|---|---|---|
| 3,861,334 A | * | 1/1975 | Stockman | 110/187 |
| 5,462,397 A | * | 10/1995 | Iwabuchi | 414/217 |
| 6,599,119 B1 | * | 7/2003 | Wood et al. | 431/115 |
| 2006/0081181 A1 | * | 4/2006 | Miyazaki et al. | 118/715 |
| 2008/0095678 A1 | * | 4/2008 | Hasebe et al. | 422/198 |
| 2008/0199818 A1 | * | 8/2008 | Nitadori et al. | 432/6 |
| 2009/0017637 A1 | * | 1/2009 | Huang et al. | 438/758 |
| 2009/0053665 A1 | * | 2/2009 | Haraki et al. | 432/1 |
| 2009/0092468 A1 | * | 4/2009 | Oyama et al. | 414/222.01 |
| 2009/0092940 A1 | * | 4/2009 | Hishiya et al. | 432/36 |
| 2009/0197424 A1 | * | 8/2009 | Sakai et al. | 438/758 |
| 2010/0229416 A1 | * | 9/2010 | Aburatani et al. | 34/194 |
| 2010/0316968 A1 | * | 12/2010 | Mochizuki et al. | 432/11 |

FOREIGN PATENT DOCUMENTS

| | | | |
|---|---|---|---|
| JP | 04-137526 | | 5/1992 |
| JP | 2002-175999 | | 6/2002 |
| JP | 2002-176045 | | 6/2002 |
| JP | 3502514 | | 3/2004 |
| JP | 2005-050955 | | 2/2005 |
| JP | 4042812 | | 2/2008 |
| KR | 1020020073845 | * | 6/2004 |

* cited by examiner

*Primary Examiner* — Steven B McAllister
*Assistant Examiner* — Steven Anderson, II
(74) *Attorney, Agent, or Firm* — IPUSA, PLLC

(57) ABSTRACT

In a loading area below a vertical furnace of a thermal treatment apparatus, a gas stream flows along a first direction from one side to the other side of the loading area into a first evacuation opening provided in the other side of the loading area. A thermal evacuation part is located, along the first direction, between a first evacuation opening and an upstream end of a substrate holding member located at an unload position that is located between the one side and the other side of the loading area. The thermal evacuation part includes a second evacuation opening that is arranged to oppose at least an upper part of the substrate holding member located at the unload position and evacuates an environment around the substrate holding member located at the unload position.

9 Claims, 23 Drawing Sheets

THERMAL TREATMENT APPARATUS AND THERMAL TREATMENT METHOD

CROSS-REFERENCE TO RELATED APPLICATION

The present application is based on Japanese Patent Applications No. 2011-027664 filed with the Japanese Patent Office on Feb. 10, 2011, the entire contents of which are hereby incorporated herein by reference.

BACKGROUND OF THE INVENTION

1. Field of the Invention

The present invention relates to a thermal treatment apparatus where substrates such as semiconductor wafers are held in a substrate holder and the substrate holder is loaded into a vertical furnace where a predetermined process is carried out with respect to the substrates. Specifically, the present invention relates to a technology that is capable of reducing a period of time required to cool the substrate held in the substrate holder unloaded from the vertical furnace.

2. Description of the Related Art

A semiconductor device manufacturing apparatus includes a vertical thermal treatment apparatus where plural semiconductor wafers (referred to as wafers) are thermally treated in batch. In such a thermal treatment apparatus, the wafers stored in shelves in a wafer carrier such as a Front-Opening Unified Pod (FOUP) are transferred to a wafer boat and the wafer boat is loaded into a vertical furnace, where the substrates are concurrently thermally treated in the vertical furnace. After the thermal treatment is completed, the wafer boat is brought down from the vertical furnace, the wafers are cooled, and then the wafers are transferred back to the FOUP by a transfer robot.

At the time of unloading the wafer boat from the furnace, a temperature of the wafers is about 800° C. If the wafers at such a high temperature are transferred into the FOUP, which is made of, for example, a resin that is not tolerant to heat, may melt or cause degassing. In addition, the transfer robot may be thermally deformed. Therefore, the wafers cannot be transferred into the FOUP immediately after the wafer boat is brought down from the vertical furnace, and thus the wafers are kept at an unload position, which is below the vertical furnace, until the wafers are cooled to 70° C. or 80° C.

Patent Document 1 listed below discloses a technology that causes a clean gas to flow in a horizontal direction in the unload position below the vertical furnace, according to which the wafers located in the unload position can be cooled by the clean gas flow. In addition, Patent Document 2 discloses a cooling nozzle that blows a cooling gas to the wafer boat located in the unload position, thereby cooling the wafers. Moreover, Patent Document 3 discloses a transfer area that is enclosed by partition walls below the vertical furnace and is purged with a non-oxidizing gas such as nitrogen gas.

As the wafers become larger and the number of wafers held in the wafer boat is increased from a viewpoint of higher productivity, a thermal capacity of the wafers and the wafer boat tends to be increased. Under such circumstances, members or parts that are provided in the unload position are exposed to a large amount of heat, which may require an improved heat tolerance of the members or parts. Therefore, it is required to cool the wafers in a shorter period of time.

However, it still takes a longer time to cool the wafers according to a conventional technique for cooling the wafers and the wafer boat, and thus a longer cooling time is necessary. Therefore, it takes a long time to transfer the wafers back to the FOUP, which leads to a reduced production throughput.

Patent Document 1: Japanese Patent Application Laid-Open Publication H04-137526 (FIG. 1)

Patent Document 2: Japanese Patent Publication No. 4042812 (paragraph 0022, FIG. 4)

Patent Document 3: Japanese Patent Publication No. 3502514 (paragraph 0003)

SUMMARY OF THE INVENTION

The present invention has been made in view of the above, and provides a technology that is capable of reducing a period of time required to cool a substrate held in a substrate holding member unloaded from a vertical furnace.

According to a first aspect of the present invention, there is provided a thermal treatment apparatus in which a substrate holding member where plural substrates are stacked in the form of shelves is transferred into a furnace, thereby thermally treating the plural wafers. The thermal treatment apparatus includes a loading area located below the furnace; a substrate holding member elevating mechanism that carries the substrate holding member between a load position within the furnace and an unload position below the furnace, the substrate holding member elevating mechanism is arranged in the loading area; a gas stream creating mechanism that creates a substantially horizontal gas stream that flows along a first direction from one side to the other side of the loading area into a first evacuation opening provided in the other side of the loading area; a substrate holding member transfer mechanism that carries the substrate holding member to the unload position; and a thermal evacuation part that is located between the first evacuation opening and an upstream end of the substrate holding member located at the unload position along the first direction, the thermal evacuation part including a second evacuation opening that is arranged to oppose at least an upper part of the substrate holding member located at the unload position and evacuates an environment around the substrate holding member located at the unload position.

According to a second aspect of the present invention, there is provided a thermal treatment method in which a substrate holding member where plural substrates are stacked in the form of shelves is transferred into a furnace, thereby thermally treating the plural wafers. The thermal treatment method includes steps of: creating a substantially horizontal gas stream that flows along a first direction from one side to the other side of the loading area into a first evacuation opening provided in the other side of the loading area in a loading area located below the furnace; transferring the substrate holding member to an unload position below the furnace, using a substrate holding member transfer mechanism; carrying the substrate holding member from the unload position to a load position within the furnace and from the load position to the unload position, using a substrate holding member elevating mechanism; and evacuating an environment around the substrate holding member located at the unload position, using a thermal evacuation part that is located between the first evacuation opening and an upstream end of the substrate holding member located at the unload position along the first direction, the thermal evacuation part including a second evacuation opening that is arranged to oppose at least an upper part of the substrate holding member located at the unload position and evacuates an environment around the substrate holding member located at the unload position.

DETAILED DESCRIPTION OF THE PREFERRED EMBODIMENT

A thermal treatment apparatus according to an embodiment of the present invention is provided with a thermal evacuation part, among other members or parts. The thermal evacuation part is located between a first evacuation opening and an upstream end of a substrate holding member located below a vertical furnace (or at an unload position) along a first direction from one side to the other side of a loading area of the thermal treatment apparatus, where the first evacuation opening is provided on the other side of the loading area. In addition, the thermal evacuation part includes a second evacuation opening that is arranged to oppose at least an upper part of the substrate holding member located at the unload position, thereby evacuating an environment around the substrate holding member. Therefore, the heated environment around the substrate holding member that has been unloaded from the vertical furnace can be evacuated by the thermal evacuation part, thereby reducing an upward thermal diffusion and turbulence of a substantially horizontal gas stream that flows along the first direction from one side to the other side of the loading area into the first evacuation opening provided in the other side of the loading area. According to the thermal evacuation as well as the substantially horizontal gas stream, the substrate holding member and substrates in the substrate holding member can be cooled in a relatively shorter period of time, even when the substrate holding member and the substrates have a relatively large thermal capacity. In addition, because the substrate holding member and the substrates are cooled in a relatively shorter period of time, thermal influence on members or parts in the loading area can be reduced.

Figure 1:
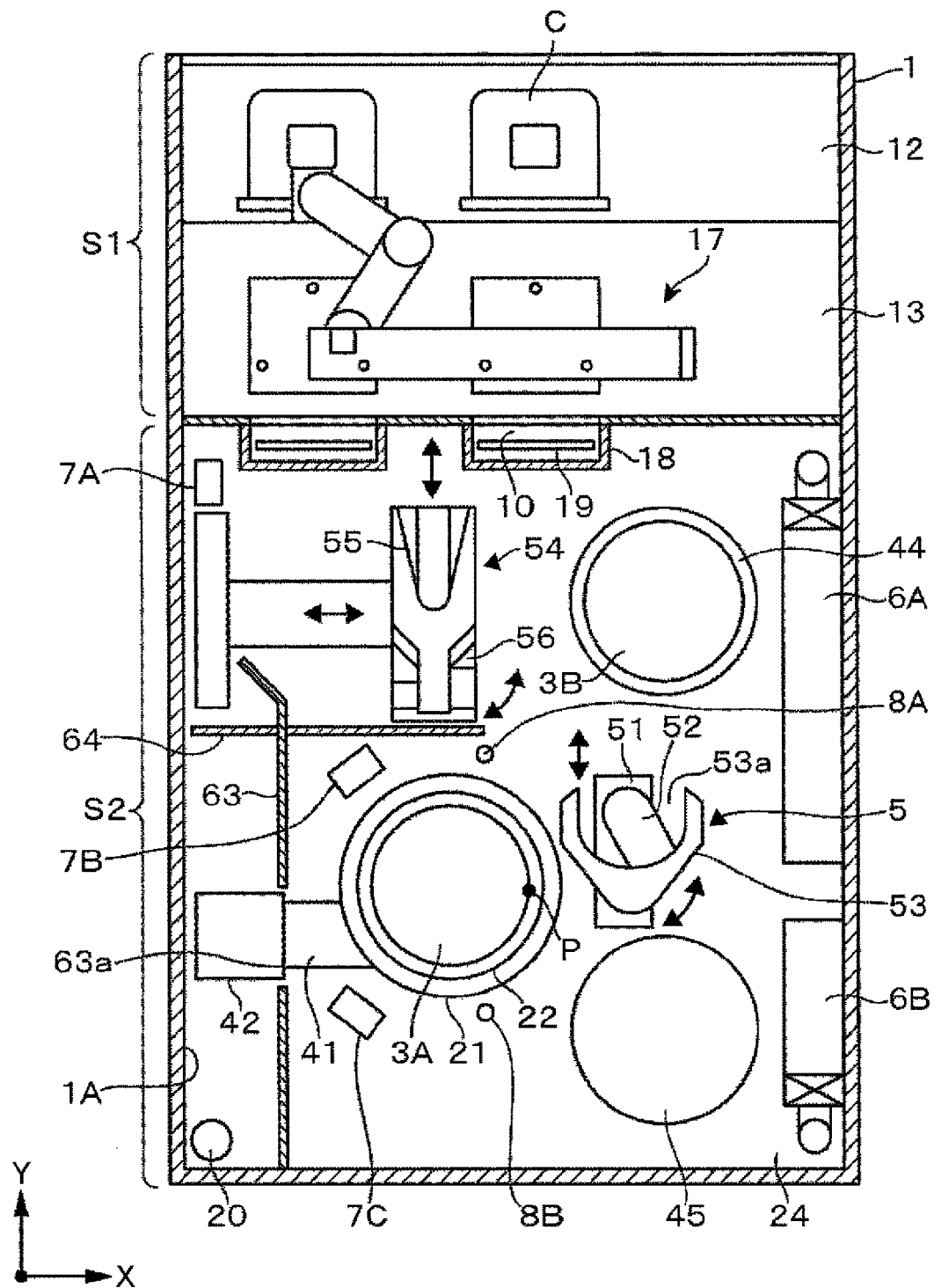
FIG. 1 is a plan view of an entire structure of a vertical thermal treatment apparatus according to an embodiment of the present invention.
Figure 2:
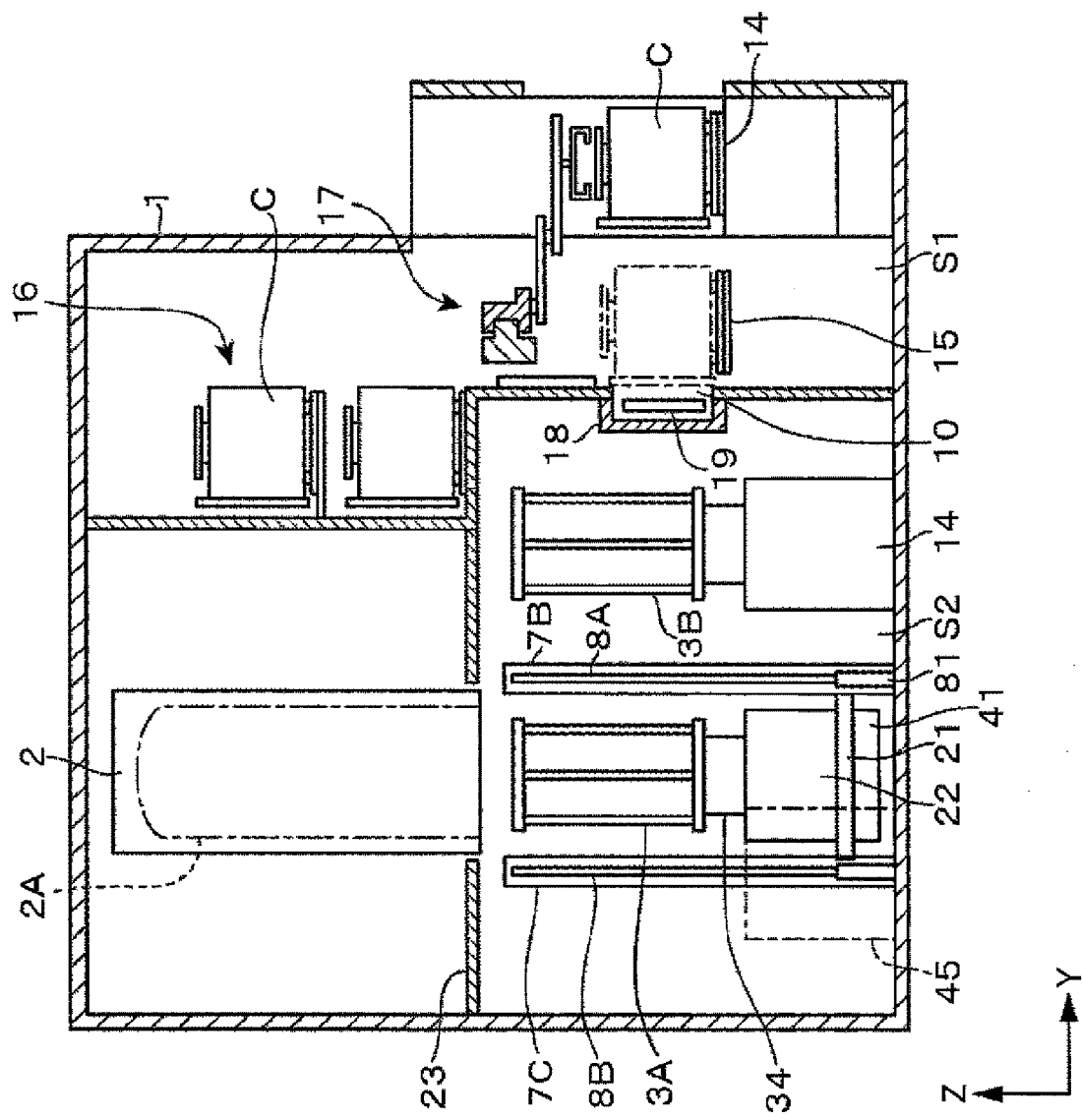
FIG. 2 is a vertical cross-sectional view of the vertical thermal treatment apparatus according to the embodiment.
Figure 3:
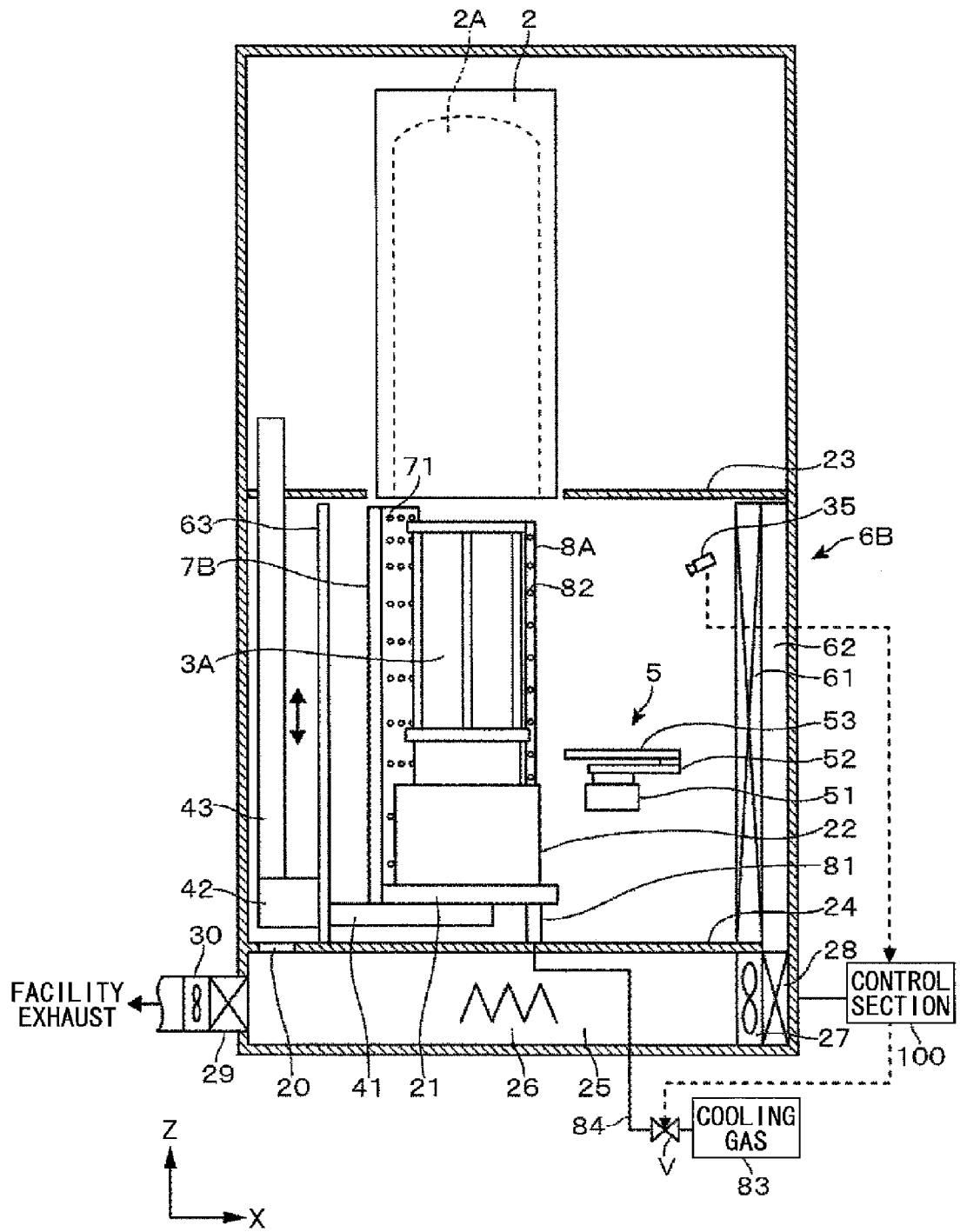
FIG. 3 is another vertical cross-sectional view of the vertical thermal treatment apparatus according to the embodiment.

A vertical thermal treatment apparatus according to an embodiment of the present invention is explained in the following. FIG. 1 is a plan view illustrating an inner structure of the vertical thermal treatment apparatus. For the convenience of explanation, a right hand side of the drawing is referred to as a front side; a left hand side of the drawing is referred to as a rear side; an X axis direction in FIG. 1 is referred to as a front-rear direction; and a Y axis direction in FIG. 1 is referred to as a left-right direction. FIG. 2 is a vertical cross-sectional view of the vertical thermal treatment apparatus, seen from the front side; and FIG. 3 is vertical cross-sectional view of the vertical thermal treatment apparatus, seen from the left side.

A reference symbol 1 in the drawings represents a chassis inside of which a transferring area S1 and a loading area S2 are defined. In the transferring area S1, carriers C that store substrates (wafers) W are placed and the wafers W are transferred into the loading area S2. In the loading area S2, the wafers W from the carriers C are loaded into a vertical furnace 2 (described later). The transferring area S1 and the loading area S2 are partitioned by a partition wall 11. The transferring area S1 is in an atmospheric environment, and the loading area S2 is, for example, in a clean dry gas environment. Namely, the loading area S2 is filled with, for example, a clean dry gas. The clean dry gas may be an air that has a reduced amount of particles and organic substances and has a dew point of −60° C.

The transferring area S1 includes a first area 12 and a second area 13 located in the rear side of the first area 12 along the Y direction (FIG. 1). The first area 12 is provided with a first pedestal 14 on which the carrier C is placed. As the carrier C, an encapsulated type Front-Opening Unified Pod made of a resin is used. Plural (for example, twenty five) wafers W, each of which have a diameter of 300 mm, are accommodated in the form of shelves in the FOUP. The FOUP is provided with a lid that can open or close a front opening of the FOUP.

The second area 13 is provided with a second pedestal 15 and carrier storages 16. In addition, the second area 13 is provided with a carrier transfer mechanism 17 that transfers the carrier C from the first pedestal 14 or the second pedestal 15 to the carrier storages 16, or from the carrier storages 16 to the first pedestal 14 or the second pedestal 15. A reference symbol 10 in FIG. 1 represents an opening that allows spatial communication between the interior of the carrier C and the loading area S2; a reference symbol 18 represents a door of the opening 10; and a reference symbol 19 represents a lid opening or closing mechanism.

Referring to FIG. 2, the loading area S2 is provided with the vertical furnace 2 that has an opening at the bottom end. In addition, two wafer boats 3 (3A, 3B), which serve as a substrate holding member, are provided in the loading area S2. The wafer boats 3 (3A, 3B) accommodate plural wafers in the form of shelves.

Incidentally, the wafer boat is referred to with the reference symbol "3", when the wafer boats 3A, 3B do not need to be separately referred to.

Next, the wafer boat 3 is explained in detail with reference to FIG. 4. The wafer boat 3 is provided with a top plate 31, a bottom plate 32, and four pillars 33 between the top plate 31 and the bottom plate 32. Each of the four pillars 33 has grooves (not shown) by which a circumferential edge of the wafer W is held, so that the 100 wafers W are held at predetermined intervals in a vertical direction. A supporting member 34 is provided below the bottom plate 32.

Three stages on which the wafer boats 3 are placed are provided in the loading area S2. One of the stages is provided on a boat elevator 41, which serves as a substrate holding member elevating mechanism that is configured to be brought upward and downward. On the boat elevator 41, there are provided a lid member 21 of the vertical furnace 2 and a thermal insulating member 22 in this order. The insulating member 22 is made of, for example, quartz, and the wafer boat 3 is placed on the insulating member 22.

The boat elevator 41 can be brought upward and downward along a guide rail 43 extending in a vertical direction (see FIG. 3) by a moving mechanism 42, so that the wafer boat 3 is brought upward and downward between a load position and an unload position. The load position indicates a position of the wafer boat 3 that is within the vertical furnace 2. When the wafer boat 3 is at the load position, the lid member 21 is brought up thereby closing the bottom opening of the vertical furnace 2. On the other hand, the unload position indicates a position of the wafer boat 3 that is below the vertical furnace 2 (see FIGS. 1 through 3). The guide rail 43 is provided in rear of and at the left hand side of the loading area S2.

Referring again to FIG. 1, a first stage 44 and a second stage 45 are provided. The wafer boat 3 is placed on the first stage 44 when the wafer W is transferred between the wafer boat 3 and the carrier C, which may be placed on the second pedestal 15. On the other hand, the wafer boat 3 is temporarily placed on the second stage 45 before and after a thermal treatment is carried out in the vertical furnace 2.

In addition, a wafer boat transfer mechanism 5 is provided between the first stage 44 and the second stage 45. The wafer boat transfer mechanism 5 transfers the wafer boat 3 between the first stage 44 and the second stage 45. The wafer boat transfer mechanism 5 serves as a substrate holding member transfer mechanism, and includes a multi-joint arm 52 that can move upward and downward, rotates around a vertical axis and move back and forth. A holding arm 53 having a top view shape of U is provided at a distal end of the multi-joint arm 52. An opening 53a of the U-shaped holding arm 53 is larger than the supporting member 34 and smaller than the bottom plate 32.

Figure 5:
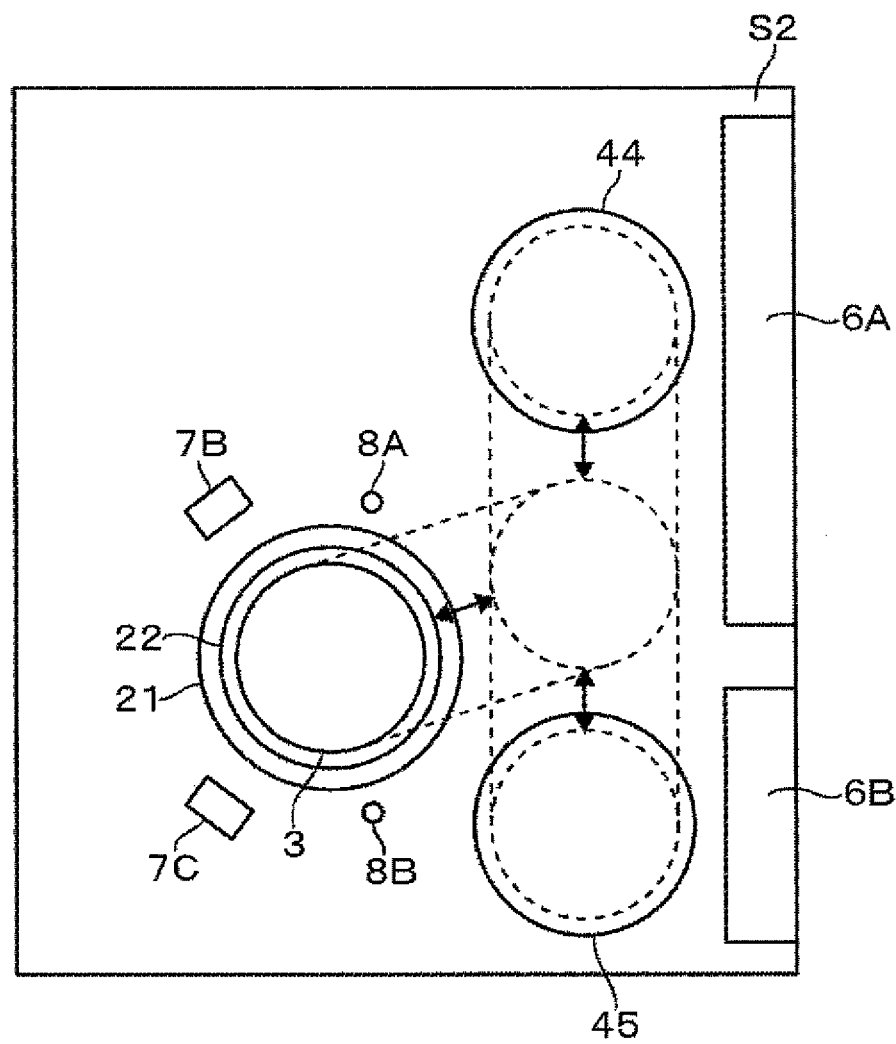
FIG. 5 is a plan view that schematically illustrates a loading area of the vertical thermal treatment apparatus according to the embodiment.

In the illustrated example, the wafer boat transfer mechanism 5 is arranged on the right side of the boat elevator 41 when the wafer boat 3 is at the load position; the first stage 44 is arranged on the right side of the wafer boat transfer mechanism 5, when seen from the front side of the vertical thermal treatment apparatus; and the second stage 45 is arranged on the left side of the wafer boat transfer mechanism 5, when seen from the front side of the vertical thermal treatment apparatus. The U-shaped holding arm 53 of the wafer boat transfer mechanism 5 surrounds the supporting portion 34 of the wafer boat 3, moves upward to contact the bottom plate 32, thereby lifting the wafer boat 3. Then, the wafer boat transfer mechanism 5 moves the wafer boat 3 and places the wafer boat 3 in its destination. The wafer boat 3 is brought from one of the stages 44, 45 to the wafer boat transfer mechanism 5, and then to the other one of the stages 44, 45, as shown by a dotted line in FIG. 5.

In addition, a wafer transfer mechanism 54, which serves as a substrate transfer mechanism, is provided, for example, in the rear side of the first stage 44 in the loading area S2. The wafer transfer mechanism 54 transfers the wafer W from (or to) the wafer boat 3 on the first stage 44 to (or from) the carrier C on the second pedestal 15. The wafer transfer mechanism 54 is provided with plural (for example, five) forks 55, each of which holds the wafer W, and a transfer body 56 that supports the forks 55 and moves the forks 55 back and forth. The transfer body 56 can be rotated around a vertical axis, and brought upward and downward, and moved in the X direction in FIG. 1.

In addition, a ceiling portion 23 is formed substantially at the height of the opening of the vertical furnace 2 in an area excluding the vertical furnace 2 in the loading area S2. A first filter unit 6A and a second filter unit 63 are provided on an inner surface of a front wall of the chassis 1. Specifically, the second filter unit 6B is located on the left hand side of the first filter unit 6A, when seen from the front of the vertical thermal treatment apparatus. The filter units 6A, 6B extend in a vertical direction (a Z direction in FIG. 3), so that top ends of the filter units 6A, 6B are located near the ceiling portion 23 and bottom ends of the filter units 6A, 6B are connected to the bottom plate 24 (only the second filter unit 63 is illustrated in FIG. 3). Each of the filter units 6A, 6B is provided with a filter portion 61 and is arranged in a space 62 located on the front of the filter portion 61. The space 62 is in pressure communication with a ventilation area 25 formed below the bottom plate 24 in the loading area S2.

On the other hand, a thermal shielding plate 63 is provided near a rear wall 1A of the loading area S2, in order to shield a driving mechanism of the boat elevator 41 from heat of the wafer boat 3 and the wafers W in the wafer boat 3. The thermal shielding plate 63 corresponds to a rear plate opposing a front wall of the loading area S2, and is arranged between a space where the moving mechanism 42 and the guide rail are located and the wafer boat 3 located at the unload position. In addition, the top end of the shielding plate 63 is positioned near the ceiling portion 23 and the bottom end of the shielding plate 63 is positioned on the bottom plate 24. Moreover, the shielding plate 63 has an opening 63a that allows the moving mechanism 42 to move in a vertical direction (a Z direction in FIG. 3). The opening 63a corresponds to an evacuation opening through which a gas supplied to the loading area S2 from the filter units 6 is evacuated.

In addition, a partition plate 64 is provide between a space where the wafer transfer mechanism 54 is located and the wafer boat 3 located at the unload position. Moreover, a radiation thermometer 35 that measures a temperature of the wafer boat 3 located at the unload position.

In addition, a cooling gas supplying part 8 and evacuation ducts 7A, 7B, 7C (thermal evacuation part) are provided in the loading area S2. The evacuation duct 7A is arranged near the transferring area 31 in the loading area S2, more specifically near the rear wall 1A opposing the first filter unit 6A, so that the evacuation duct 7A does not interfere with movement of the wafer transfer mechanism 54.

Incidentally, the evacuation ducts 7A, 7B, 70 may be referred to simply as the evacuation duct (s) 7 when they do not need to be separately referred to.

In addition, the evacuation duct 7B (a first thermal evacuation part) is arranged on the rear side with respect to a front end P of the wafer boat 3 at the unload position and on the front side with respect to the opening 63a of the shielding plate 63; and the evacuation duct 7C (a second thermal evacuation part) is arranged on the front side with respect to the front end P of the wafer boat 3 at the unload position and on the front side with respect to the opening 63a of the shielding plate 63. In the illustrated example, the evacuation duct 7B is arranged on the left hand side of the wafer boat 3 at the unload position, and the evacuation duct 7C is arranged on the right hand side of the boat 3 at the unload position, when seen along the front-rear direction (X direction).

Figure 4:
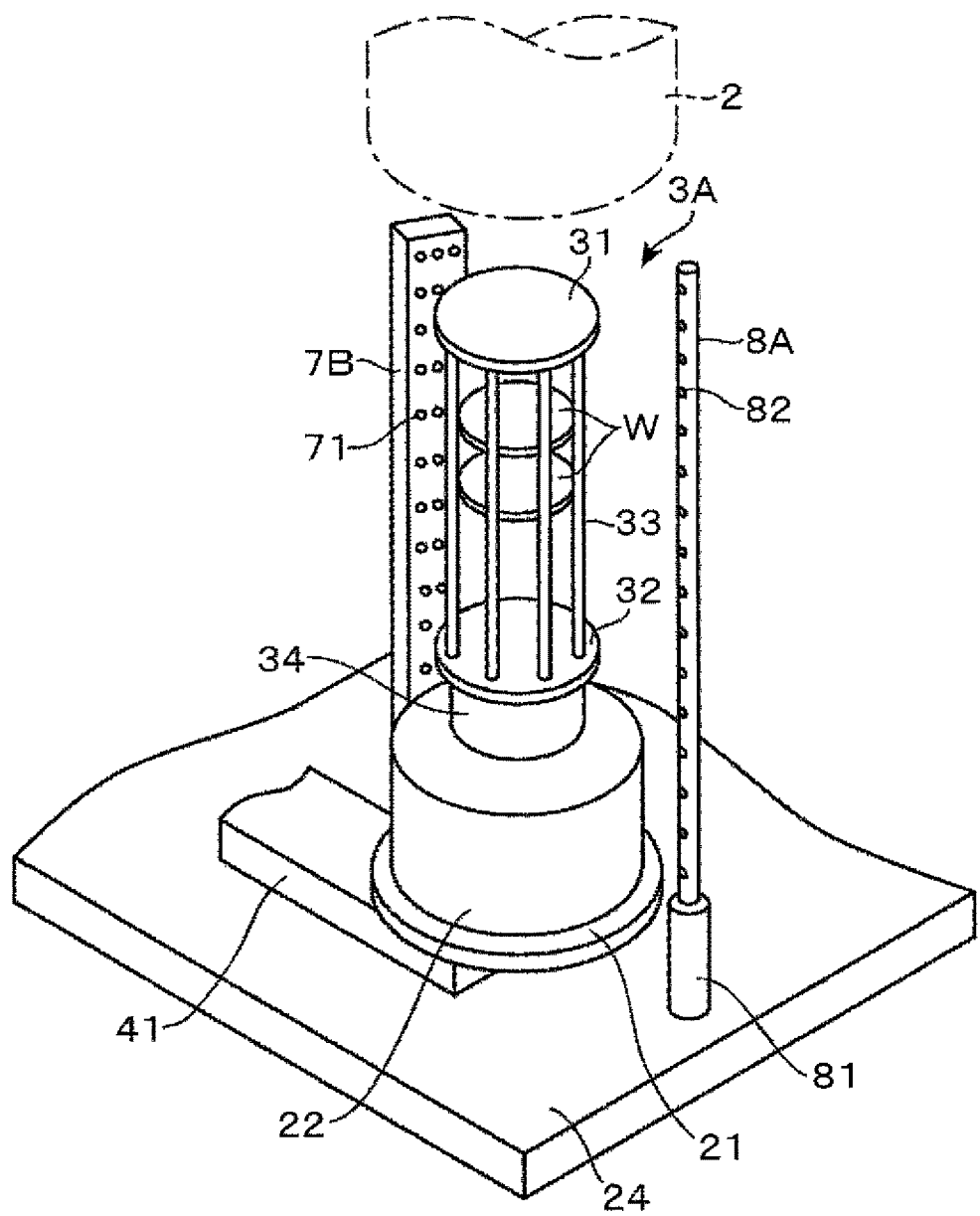
FIG. 4 is a schematic perspective view of a wafer boat, an evacuation duct, and a cooling gas nozzle in the vertical thermal treatment apparatus according to the embodiment.

The evacuation ducts 7A through 7C are made of a tube member that extends in the vertical direction, as shown in FIGS. 3 and 4. Top ends of the evacuation ducts 7A through 7C are located, for example, near the ceiling portion 23, and bottom ends of the evacuation ducts 7A through 7C are connected to the bottom plate 24 and in gaseous communication with the ventilation area 25. In the illustrated example, the evacuation ducts 7A through 7C are made of a tube member having a cross-sectional (or a top view) of rectangular.

Each of the evacuation ducts 7B, 7C is arranged so that a long side of the rectangular shape opposes the wafer boat 3 located at the unload position, and has plural evacuation holes 71, which serve as thermal evacuation holes, on a surface 70 that opposes the wafer boat 3 located at the unload position. The evacuation holes are arranged at least in an area that opposes an upper area of the wafer boat 3 at the unload position, and evacuate an environment heated by the wafer boat 3 and the wafers W on the wafer boat 3 that are unloaded from the vertical furnace 2. Here, the upper area of the wafer boat 3 corresponds to an area where product wafers W are loaded in the wafer boat 3.

In the illustrated example, the evacuation holes 71 are distributed in a whole area of the surface 70 that opposes the wafer boat 3. In addition, the evacuation hole 71 located at the top end of the surface 70 has the largest opening area, and the opening areas of the evacuation holes 71 become gradually smaller along a direction from the top to the bottom of the wafer boat 3, in this embodiment. Alternatively, the number of the evacuation holes 71 per unit area may be the largest in the top end area of the surface 70, and become gradually reduced along the direction from the top to the bottom of the wafer boat 3, while each of the evacuation holes 71 has the same opening area, in other embodiments. In addition, shapes of the evacuation holes 71 are circular in this embodiment, but may be slit. The evacuation duct 7A is arranged so that the long side of the rectangular shape opposes the filter units 6, and has the evacuation openings 71 on a surface that opposes the filter units 6.

Moreover, a cooling gas supplying part 8 is provided around the wafer boat 3 located at the wafer boat 3 so that the cooling supplying part 8 does not interfere with movement of the wafer boat 3 moved by the wafer boat transfer mechanism 5. The cooling gas supplying part 8 in this embodiment has two cooling gas nozzles 8A, 8B, which correspond to a first gas supplying part and a second gas supplying part, respectively. The cooling gas nozzles 8A, 8B extend in the vertical direction and are arranged on the right and the left side of the wafer boat 3 located at the unload position.

Incidentally, the cooling gas nozzles 8A, 8B, 8C may be referred to simply with a reference symbol "8" in the following when they do not need to be separately referred to.

As shown in FIG. 1, the cooling gas nozzle 8A opposes the evacuation duct 7B across the wafer boat 3; and the cooling gas nozzle 8B opposes the evacuation duct 7C across the wafer boat 3, in this embodiment. Here, the cooling gas nozzle 8A (or 8B) and the evacuation duct 7B (7C) do not necessarily oppose each other along a diameter direction of the wafer boat 3, as long as the cooling gas from the cooling gas nozzle 8A (or 8B) can flow into the evacuation duct 7B (7C) through the wafer boat 3 (or gaps between the wafers W loaded in the wafer boat 3) located at the unload position.

In the illustrated example, the top ends of the cooling gas nozzles 8A, 8B are positioned, for example, near the ceiling part 23, and the bottom ends of the cooling gas nozzles 8A, 8B are connected to the bottom plate 24 via a supporting part 81. In addition, supplying holes 82 that supply a cooling gas to the wafer boat 3 located at the unload position are formed surfaces of the cooling gas nozzles 8A, 8B, the surfaces opposing the wafer boat 3. Each of the cooling gas nozzles 8A, 8B is connected to a supplying source 83 of the cooling gas via a supplying line 84 having a valve V. As the cooling gas, nitrogen ($N_2$) gas, argon (Ar) gas, or clean dry air, which is temperature-controlled at 20 to 30° C., may be used.

Figure 6:
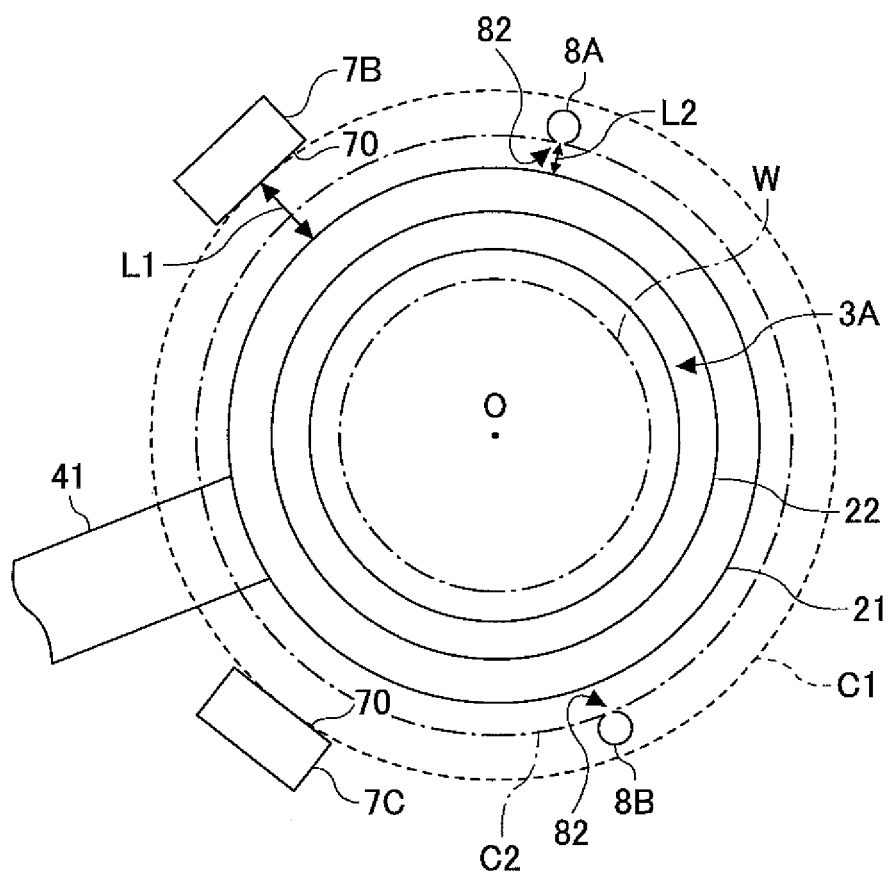
FIG. 6 is a plan view that illustrates a relationship of the wafer boat at the unload position, the evacuation ducts, and the cooling gas nozzles of the vertical thermal treatment apparatus according to the embodiment.

An example of arrangements of the evacuation ducts 7B, 7C and the cooling gas nozzles 8A, 8B in relation to the wafer boat 3 is explained with reference to FIG. 6. As shown, the evacuation ducts 7B, 7C are arranged away from each other along a circumference of a circle C1 defined by its center corresponding to a center O of the wafer boat 3 and has a larger diameter than that of the wafer boat 3. Specifically, the surfaces 70 having the evacuation holes 71 contact the circumference of the circle C1.

In addition, the evacuation ducts 7B, 7C are preferably arranged near the wafer boat 3 located at the unload position. Specifically, a distance L1 between the surfaces 70 having the evacuation holes 71 and the lid member 21 on the boat elevator 41 is, for example, about 1 mm to about 30 mm. For example, the evacuation ducts 7A through 7C have a height of about 1500 mm to about 2000 mm and a side length of about 100 mm to about 300 mm.

In addition, the cooling gas nozzles 8A, 8B are preferably arranged near the wafer boat 3 (3A) located at the unload position so that the cooling gas nozzles 8A, 8B do not interfere with movements of the wafer boat 3. In other words, it is preferable that the cooling gas nozzles 8A, 8B are arranged closer to the wafer boat 3 located at the unload position as long as the cooling gas nozzles 8A, 8B are away from an area where the wafer boat 3 moves (see FIG. 5). As shown in FIG. 6, the cooling gas nozzles 8A, 8B are arranged away from each other along a circumference of a circle C2 defined by its center corresponding to a center O of the wafer boat 3 and has a larger diameter than that of the wafer boat 3. Specifically, the supplying holes 82 of the cooling gas nozzles 8A, 8B contact the circumference of the circle C2. Specifically, a distance L2 between the supplying holes 82 and the outer circumference of the lid member 21 in the boat elevator 41 is, for example, about 1 mm to about 30 mm. For example, each of the cooling gas nozzles 8A, 8B has a height of about 1500 mm to about 1800 mm, and a diameter of about 12 mm to 15 mm. Additionally, a diameter of the supplying hole 82 is about 2 mm to about 3 mm.

Figure 7:
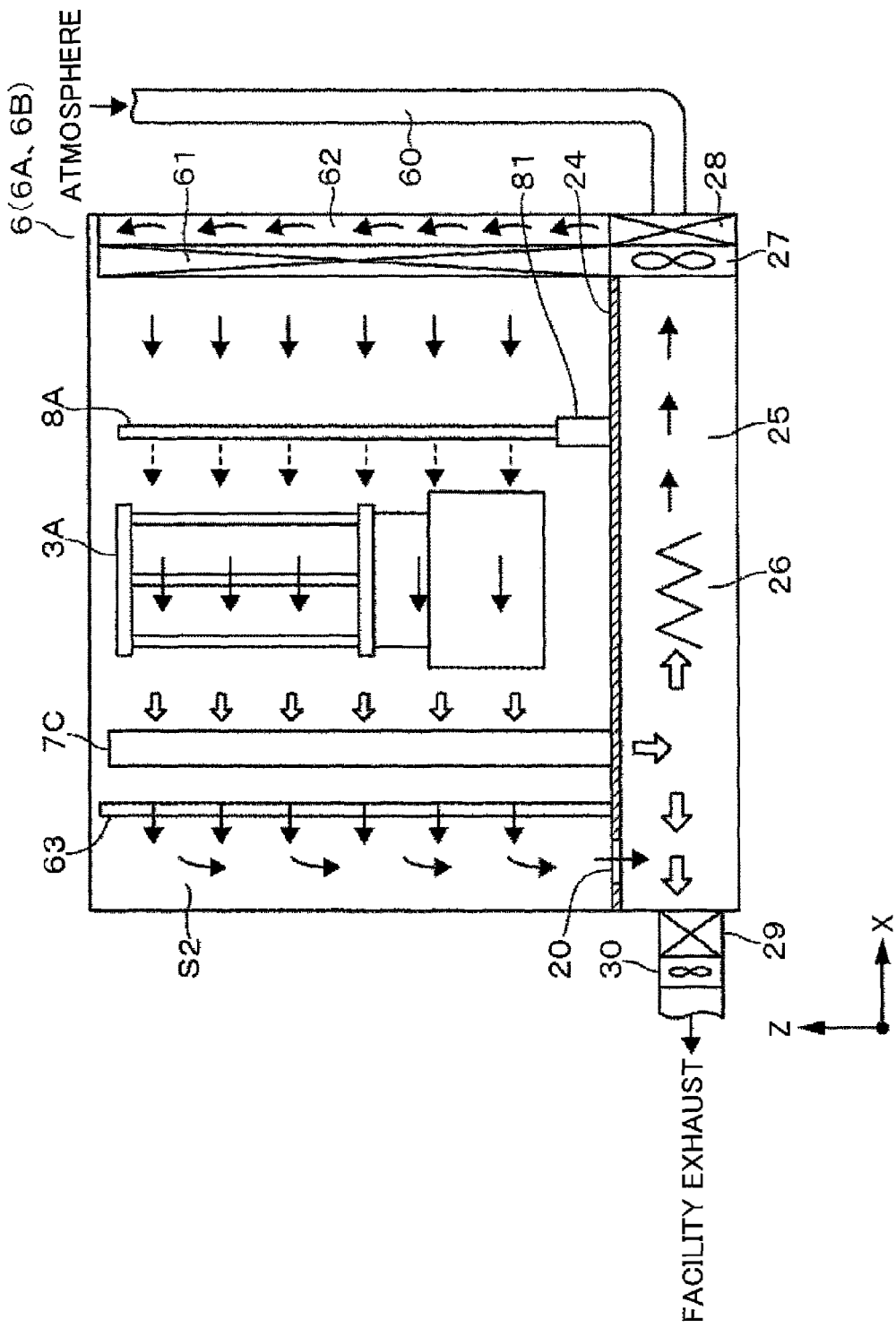
FIG. 7 is a schematic vertical cross-sectional view that illustrates a gas stream in the loading area of the vertical thermal treatment apparatus according to the embodiment.
Figure 8:
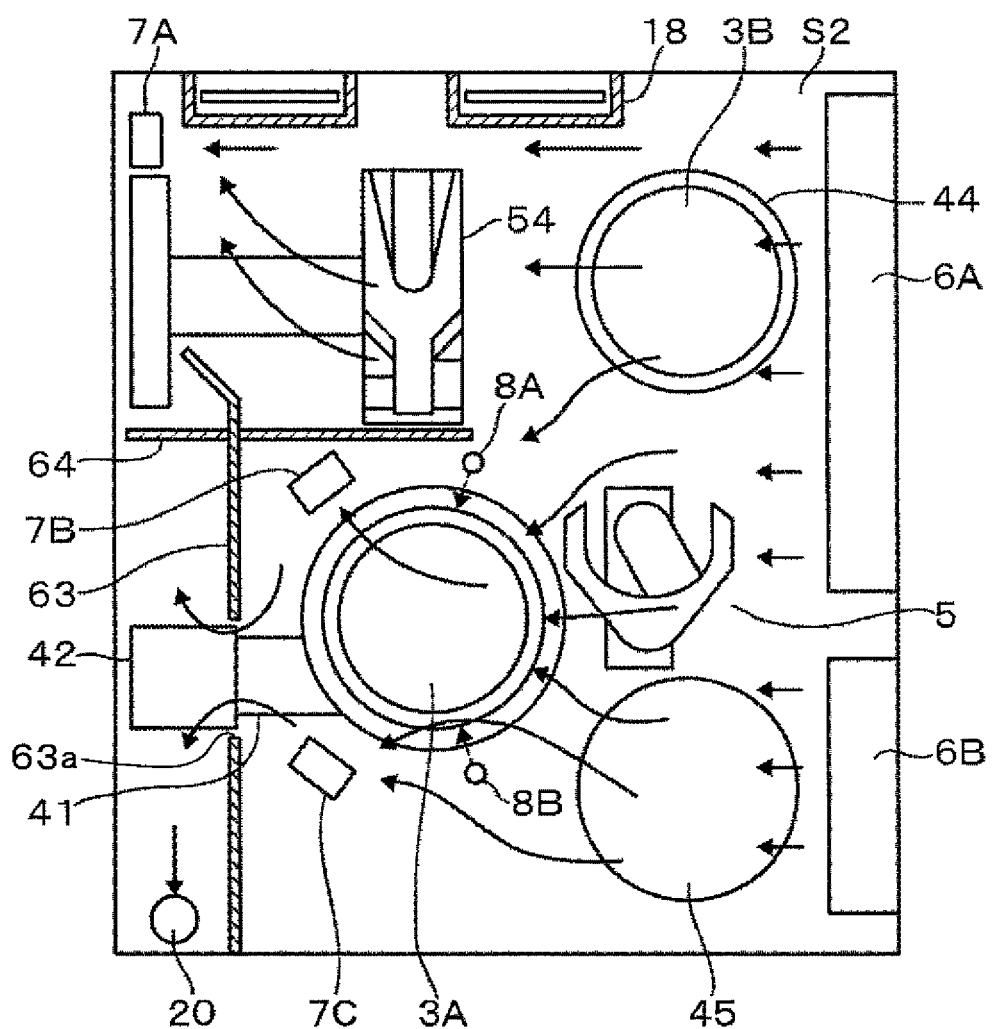
FIG. 8 is a schematic plan view that illustrates the gas stream in the loading area of the vertical thermal treatment apparatus according to the embodiment.

A radiator 26 is provided in the ventilation area 25. A first fan 27 and a first gate valve 28 are arranged on the front side of the ventilation area 25, in order to be in gaseous communication with the space 62 of the filter units 6A, 6B. In addition, a second fan 30 and a second gate valve 29 are arranged on the rear side of the ventilation area 25. The ventilation area 25 is connected to a facility evacuation via the second gate valve 29 and the second fan 30. A reference symbol 20 in FIGS. 1 and 3 represents evacuation opening formed in the bottom plate 24; and a reference symbol 60 in FIG. 7 represents an air inlet conduit.

The vertical thermal treatment apparatus is provided with a control part 100, which is formed of, for example, a computer. The control part 100 is provided with a data processing part made of a program, a memory, a Central Processing Unit (CPU), or the like. The program contains instructions (or steps) that send control signals to various parts or components of the vertical thermal treatment apparatus, thereby conducting a wafer transfer operation (described later). The program is stored in a computer readable storage medium such as a flexible disk, a compact disk, a hard disk, a magneto-optical (MO) disk, or the like, and installed into the control part 100.

For example, the control part 100 outputs control signals to the valve(s) V in order to start supplying the cooling gas from the cooling gas nozzles 8A, 8B when the wafer boat 3 is unloaded from the vertical furnace 2 by the boat elevator 41, and to stop supplying the cooling gas in accordance with a measurement value of the radiation thermometer 35.

Next, a wafer flow is explained. In the vertical thermal treatment apparatus, there are cases where an air flows in the loading area S2, and where N$_2$ gas flows in the loading area 52. When the air flows, the first gate valve 28 is opened, the second fan 30 is started; and the second gate valve 29 is opened, whereas the first fan 27 is always in operation. With this, the air having a temperature of, for example, 20° C. to 30° C. is allowed to flow into the loading area S2 through the air inlet conduit 60, and N$_2$ gas (or dry air or air) is supplied from the cooling gas nozzles 8A, 8B, as shown in FIG. 7. Specifically, the air taken from the exterior of the vertical thermal treatment apparatus flows from the filter units 6A, 6B toward the shielding plate 63 opposing the filter units 6A, 6B. Then, the air flows into the opening 63a of the shielding plate 63 and then to the ventilation area 25 through the evacuation opening 20. While a major part of the air, which has flowed into the ventilation area 25, flows out from the vertical thermal treatment apparatus, a part of the air flows toward the space 62 of the filter units 6A, 6B by the first fan 27. Then, this part of the air flows through the filter units 6A, 65, which produces the air clean, and then into the loading area S2.

Incidentally, the cooling gas, which is supplied from the cooling gas nozzle 8A (or 8B) and then flows into the evacuation ducts 7C (or 7B), also flows into the ventilation area 25 to be mixed with the air that flows into the ventilation area 25 from the loading area S2, as shown in FIG. 7.

In addition, when the N$_2$ gas is supplied into the loading area S2, the first gate valve 28 and the second gate valve 29 are first closed thereby terminating supplying the air. Next, the N$_2$ gas (cooling gas) is supplied from the cooling gas nozzles 8A, 8B. The N$_2$ gas flows into the ventilation area 25 through the evacuation ducts 7B, 7C and the opening 63a of the shielding plate 63. Because the first fan 27 is always working, the N$_2$ gas in the ventilation area 25 is supplied, as a clean gas, into the loading area S2 through the filter units 6A, 6B.

As stated above, the filter units 6 (6A, 6B) are arranged on the front side of the loading area 23 and the shielding plate 63 is arranged on the rear side of the loading area 23 in order to oppose the filter units 6 (6A, 6B). Therefore, a substantial horizontal gas flow is created from the front side to the rear side of the loading area S2, as shown by dot line arrows in FIG. 7. In this embodiment, the filter units 6A, 6B, the shielding plate 63, the opening 63a, the ventilation area 25, the first fan 27, and the second fan 30 constitute a gas stream creating mechanism.

Next, operations of (or a wafer flow in) the vertical thermal treatment apparatus is explained. First, the carrier C placed on the first pedestal 14 by a robot (not shown) is transferred to the second pedestal 15 by the carrier transfer mechanism 17, and is pressed onto the opening 10 of the partition wall 11. Next, the lid of the carrier C is removed by the lid opening or closing mechanism 19, and N$_2$ gas, for example, is supplied toward the interior of the carrier C from a N$_2$ gas supplying mechanism (not shown) thereby substituting the air in the carrier C and a space between the carrier C and the door 18 with the N$_2$ gas. Then, the door 18, the lid opening or closing mechanism 19, and the lid are moved, for example, upward and retreated from the opening 10, thereby allowing the interior of the carrier C and the loading area S2 to be in gaseous communication with each other.

On the other hand, the wafer boat 3A and the wafer boat 33 have been placed on the first stage 44 and the second stage 45, respectively, in the loading area S2. The wafers W in the carrier C are transferred to the wafer boat 3A on the first stage 44 by the wafer transfer mechanism 54. After the wafers W of the predetermined number are loaded in the wafer boat 3A, the wafer boat 3A is moved to the boat elevator 41 from the first stage 44, and placed on the insulating member 22 of the boat elevator 41 by the wafer boat transfer mechanism 5. Next, the boat elevator 44 is brought upward, and thus the wafer boat 3A is located at the load position (or within the vertical furnace 2). Then, the wafers W held in the wafer boat 3A go through a process such as film deposition, annealing, thermal oxidation, or the like at a predetermined temperature of, for example, about 400° C. to about 1000° C. in the vertical furnace 2.

After the process, the wafer boat 3A is transferred out from the vertical furnace 2, or to the unload position from the load position, by lowering the boat elevator 41, the cooling gas is supplied from the cooling gas nozzles 8A, 83 toward the wafer boat 3A located at the unload position. Thus, the wafers W in the wafer boat 3A are cooled down to a temperature of, for example, about 70° C. to about 80° C.

In this case, a cooling gas supplying timing (or a point of time when the cooling gas starts being supplied) and a cooling gas terminating timing (or a point of time when the cooling gas is terminated) are controlled by the control part 100. In this embodiment, the cooling gas starts being supplied from the cooling gas nozzles 8A, 8B before the wafer boat 3A is brought down from the vertical furnace 2. However, the cooling gas may start being supplied after the wafer boat 3 is positioned at the unload position. In addition, supplying the cooling gas may be terminated when a temperature of the wafers W, which is measured by the radiation thermometer 35, becomes about 70° C. to about 80° C.

Here, when the wafer boat 3A is transferred to the unload position from the vertical furnace 2, an environment surrounding the wafer boat 3A is heated up to a relatively high temperature by the wafer boat 3A and the wafers W therein, because the wafer boat 3 has a relatively large heat capacity. However, the environment is cooled in a relatively short period of time, because the environment is evacuated by the evacuation ducts 7B, 7C. Even when a temperature of an environment in the ventilation area 25 is raised by the air from the loading area S2, the environment of the ventilation area 25 can be cooled by the radiator 26, and the cooled air and/or gas in the ventilation area 25 circulates into the filter units 6A, 6B and then into the loading area S2. Incidentally, apart of the environment in the ventilation area 25 is exhausted to the exterior of the vertical thermal treatment apparatus through a scavenger exhaust mechanism (not shown).

As stated, the wafer boat 3A is cooled in a relatively shorter period of time by the substantially horizontal gas flow created by the filter units 6A, 63 and the opening 63a of the shielding plate 63 in the loading area S2, supplying the cooling gas from the cooling gas nozzle 8A, 8B, and evacuating the cooling gas from the evacuation ducts 7A through 7C.

When the wafer boat 3A is unloaded after the thermal process and the air and/or $N_2$ gas at a temperature of 20° C. to 30° C. is supplied from the filter units 6A, 63 toward the wafer boat 3A, the gas and/or $N_2$ gas is rapidly heated by the heated wafer boat 3A, which has a relatively large heat capacity. Then, the heated air and/or $N_2$ gas tries to flow upward and thus the heat is diffused upward. However, because at least the upper area of the environment surrounding the wafer boat 3A is evacuated by the evacuation holes 71, the heated gas and/or $N_2$ gas does not flow upward but evacuated from the evacuation holes 71, and thus the upward thermal diffusion is avoided.

Here, when the upward thermal diffusion takes place in the loading area S2, the substantially horizontal gas flow may be disturbed. However, because such upward thermal diffusion is avoided by the evacuation from the evacuation ducts 7B, 70, such disturbance of the substantially horizontal gas flow is suppressed, and thus the substantially horizontal gas flow is maintained. Therefore, the gas and/or $N_2$ gas is supplied from the filter units 6A, 6B toward the wafer boat 3A located at the unload position and the wafers W in the wafer boat 3A, and evacuated by the evacuation ducts 73, 70, and thus the wafer boat 3A and the wafers W therein are cooled in a relatively shorter period of time, which reduces a period of time required to cool the wafers W after unloading.

Figure 9:
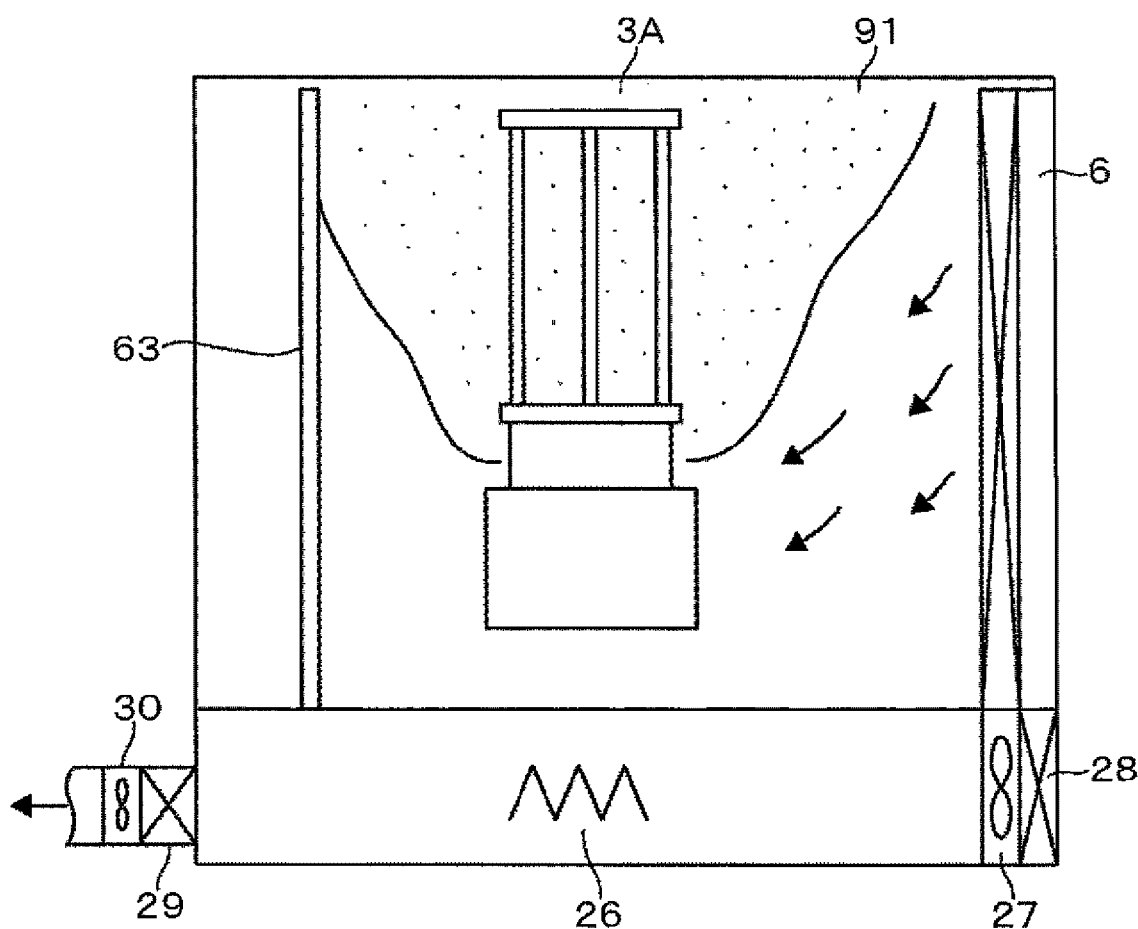
FIG. 9 is a schematic vertical cross-sectional view that illustrates a gas stream in the loading area when the evacuation duct is not arranged, for comparison purposes.

Next, a case where the evacuation ducts 7 are not provided is explained with reference to FIG. 9. In this case, after the wafer boat 3A and the wafers W therein are unloaded, they are cooled by the air and/or $N_2$ gas from the filter units 6A, 63 and by the cooling gas from the cooling gas nozzles 8. Incidentally, the wafer boat 3A and the wafers W have a relatively large heat capacity as the size of wafer to be used in this industry becomes larger and thus the wafer boat 3A also becomes large-sized. Therefore, the gas and/or $N_2$ gas is rapidly heated and flows upward, which creates a high temperature area 91 near the wafer boat 3A. As understood from explanation of reference example described later, the gas and/or $N_2$ gas supplied from the filter units 6A, 63 flow downward below the high temperature area 91 because of the high temperature area 91. Therefore, the relatively cool air and/or $N_2$ gas is not supplied to the wafer boat 3A, and thus a cooling efficiency is reduced and a period of time required to cool the wafer boat 3A and the wafers W therein is increased.

The wafer boat 3A cooled in such a manner in the unload position is transferred temporarily to the second stage 45 and then to the first stage 44 by the wafer boat transfer mechanism 5. Then, the wafers W in the wafer boat 3A are transferred into the carrier C by the wafer transfer mechanism 54.

In this embodiment, the evacuation ducts 7B, 7C, which oppose at least an upper part of the wafer boat 3A located at the unload position, are provided at positions between the front end P of the wafer boat 3A located at the unload position and the opening 63a of the shielding plate 63 in the loading area S2 where the substantially horizontal gas flow is created in the front to end direction. Because the evacuation ducts 7B, 7C have the evacuation holes 71, which can evacuate a high temperature environment heated by the wafer boat 3A and the wafers W that have been unloaded from the vertical furnace 2, the wafer boat 3A and the wafers W therein can be cooled in a shorter period of time, thereby avoiding a reduced throughput.

In addition, because the evacuation holes 71 are distributed along the vertical direction and each of the evacuation holes 71 can evacuate mainly the cooling gas from the cooling gas nozzles 8, the wafers W arranged along the vertical direction can be uniformly cooled.

As patterns made in the wafers W are becoming downsized to a critical dimension of about 27 nm, a thermal history between the wafers W can be a problem. For example, when temperatures of the wafers W are different, diffusion lengths of impurities may be varied between the wafers W. In addition, thicknesses of thermal silicon oxide films, which may be grown when the wafer boat 3 is unloaded from the vertical furnace 2, may be varied. When there are large variations between the wafers W in terms of the diffusion length and a thickness of the thermal oxide film, production yields may be reduced. Because of this, it is very important to uniformly cool the wafers W.

In addition, because the opening areas of the evacuation holes 71 become smaller in a direction from the upper to the lower part of the evacuation ducts 7, an amount of the gas and/or $N_2$ evacuated from the evacuation ducts 7 is larger at the upper area of the evacuation ducts 7 and the amount becomes smaller in a direction from the upper to the lower part of the evacuation ducts 7. As explained later, an area near the upper part of the wafer boat 3A that is unloaded from the vertical furnace 2 to the unload position is likely to be a higher temperature. Therefore, the temperatures of the wafers W in the wafer boat 3A can be uniformly cooled along the vertical direction by evacuating a larger amount of the gas and/or $N_2$ gas from the upper part of the evacuation ducts 7 and a smaller amount of the gas and/or $N_2$ gas from the lower part of the evacuation ducts 7. With this, the wafers W in the wafer boat 3A can be cooled while a temperature difference between the wafers W is kept reduced.

Moreover, because in this embodiment the cooling gas is supplied from the cooling gas nozzles 8A, 82 toward the wafer boat 3A at the unload position, the time it takes to cool the wafers W can be reduced. The cooling gas is supplied from positions near the wafer boat 3A, flows through the wafer boat 3A, and is evacuated from the evacuation ducts 7B, 7C. Namely, the cooling gas surely contacts the wafer boat 3A and the wafers W, deprives the heat from the wafer boat 3A and the wafers W, and is evacuated from the evacuation ducts 7B, 7C along with the air and/or $N_2$ gas supplied from the filter units 6A, 6B to the loading area S2. Namely, supplying the cooling gas from the cooling gas nozzles 8A, 8B and evacuating the environment near the wafer boat 3A at the unload position from the evacuation ducts 7B, 8C can deprive the heat near the wafer boat 3A, and facilitate temperature reduction of the wafers W in the wafer boat 3A.

Furthermore, because the upward thermal diffusion from the wafer boat 3A and the wafers W that are unloaded from the vertical furnace 2 can be suppressed in this embodiment, thermal convection is reduced in the loading area S2. Therefore, the wafer boat transfer mechanism 5 and cables or a "Cableveyor"™ of the wafer transfer mechanism 54, and the like are not likely to be heated, so that thermal deformation of and degassing from such a mechanism or members can be suppressed. Incidentally, the Cableveyor is a support and protection installation, which is made of, for example, a resin material, for power-supplying cables and hoses, available from Tsubakimoto Chain Co. (Osaka, Japan). "Cableveyor" is a registered trademark.

In addition, because the area where the vertical furnace 2 is provided and the area where the wafer transfer mechanism 54 is provided are partitioned by the partition plate 64 in this embodiment, a thermal influence from the wafer boat 3 and the wafers W to the area where the wafer transfer mechanism is provided can be reduced. Therefore, thermal deformation of and degassing from such a mechanism or members are suppressed.

Next, other arrangements of the evacuation ducts 7 and the cooling gas nozzles 8 are explained with reference to FIGS. 10 and 11. As long as the evacuation duct (s) 7 is arranged in the rear side position with respect to the front end P of the wafer boat 3 located at the unload position and in the front side position with respect to the evacuation opening 63a of the shielding plate 63, opposing at least the upper area of the wafer boat 3 located at the unload position, and has the evacuation holes 71 that evacuate the environment near the wafer boat 3 located at the unload position, the evacuation duct (s) 7 may be arbitrarily arranged in the loading area S2.

In addition, as long as the cooling gas supplying part (the cooling gas nozzle(s) 8) is arranged in the front side position with respect to the unload position and in the rear side position with respect to the wafer boat transfer mechanism 5, and has the supplying holes 82, the cooling gas nozzle(s) 8 may be arbitrarily arranged.

Figure 10:
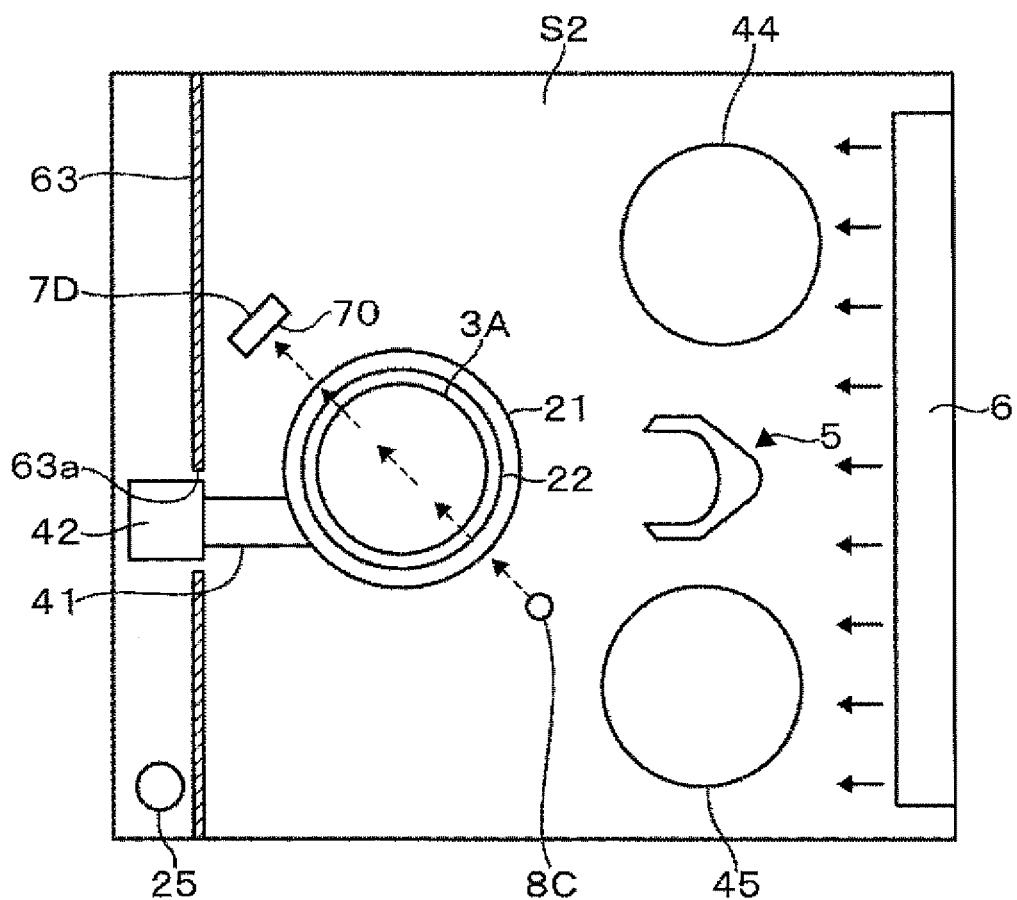
FIG. 10 is a schematic plan view that illustrates another arrangement of the evacuation duct and the cooling gas nozzle in a vertical thermal treatment apparatus according to an embodiment.

Referring to FIG. 10, an evacuation duct 7D is arranged so that the surface 70 where the evacuation holes 71 are formed faces toward the wafer boat 3A or is directed toward a direction angled toward the left-right direction from the front-rear direction, and a cooling gas nozzle 8C is arranged on the other side from the evacuation duct 7D across the wafer boat 3A. In such a configuration, the evacuation duct 7D is arranged in a right side position with respect to the wafer boat transfer mechanism 5, and the cooling gas nozzle 8C is arranged in a left side position with respect to the wafer boat transfer mechanism 5. According to this configuration, the evacuation holes 71 are directed toward the cooling gas nozzle 8C or toward a direction angled toward the left-right direction from the front-rear direction. Therefore, substantially horizontal gas flow is easily created, and thus gas flow disturbance is reduced, so that the heat of the wafer boat 3A and the wafers W that are unloaded from the vertical furnace 2 can be deprived in a relatively shorter period of time. In addition, because the cooling gas nozzle 8C and the evacuation duct 7D are arranged on the other side from each other across the wafer boat 3A, the cooling gas is assured of contacting the wafer boat 3A, flows toward the evacuation duct 7D, and can be evacuated from the evacuation duct 7D. Therefore, the cooling gas can spread in an entire area of the wafer boat 3A.

Figure 11:
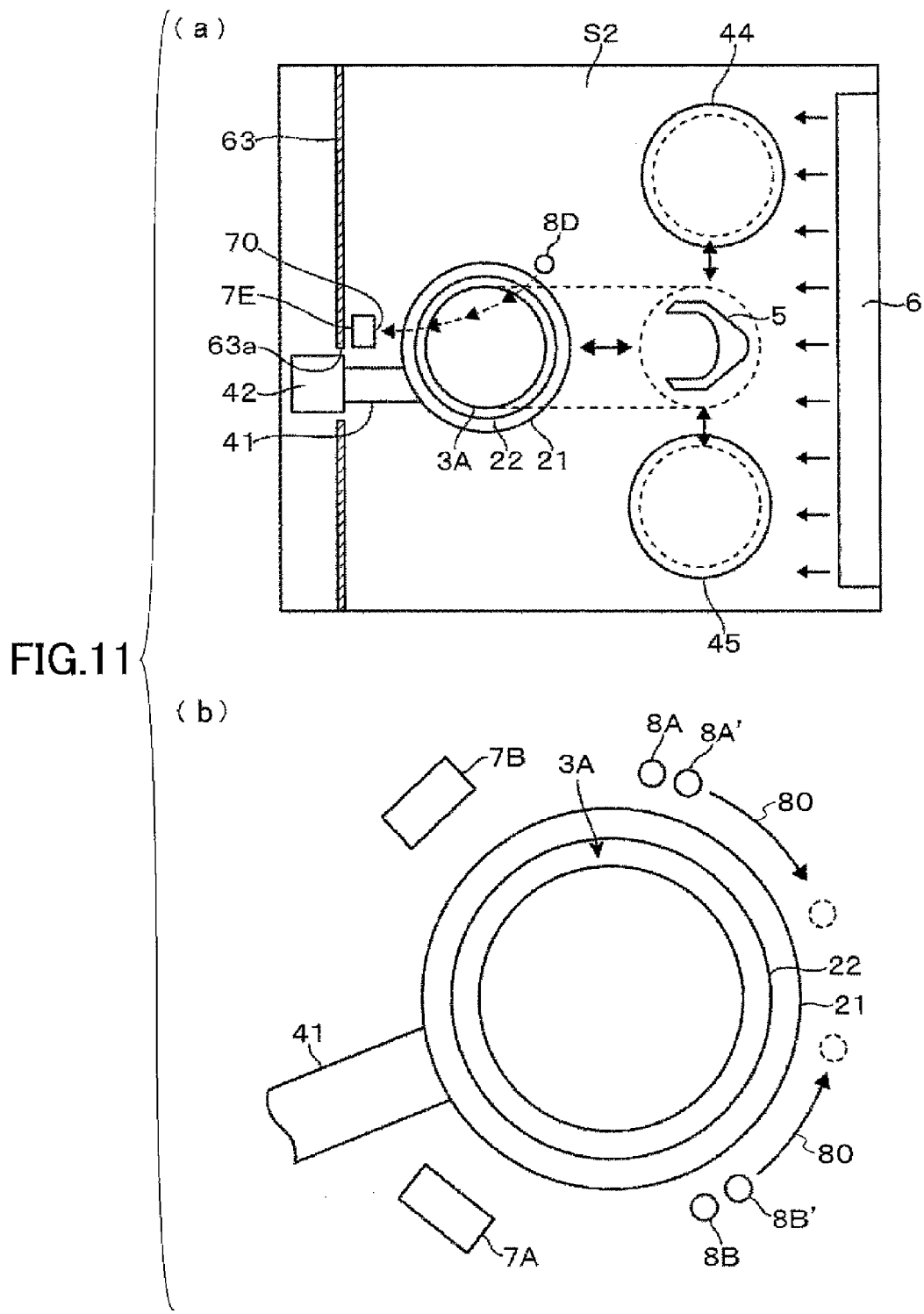
FIG. 11 is a schematic plan view that illustrates another arrangement of the evacuation duct and the cooling gas nozzle in a vertical thermal treatment apparatus according to an embodiment.

Referring to Section (a) of FIG. 11, an evacuation duct 7E is arranged so that the surface 70 having the evacuation holes 71 opposing the filter unit 6 located on the inner side of the front wall of the chassis 1 (FIG. 1). In configuration, because the evacuation holes 71 are directed toward the filter unit 6, substantially horizontal gas flow is easily created. Therefore, the heat of the wafer boat 3A and the wafers W that are unloaded from the vertical furnace 2 can be easily dissipated while the gas flow disturbance is suppressed. In addition, the evacuation duct 7E and a cooling gas nozzle 8D are arranged substantially on the right side of the wafer boat 3A. Even with this configuration, the cooling gas from the cooling gas nozzle 8D can contact the wafer boat 3A and the wafers W and be evacuated from the evacuation duct 7E.

As shown in Section (b) of FIG. 11, cooling gas nozzles 8A', 8B' that can be moved by a moving mechanism (not shown) may be arranged in addition to the cooling gas nozzles 8A, 8B in other embodiments. While the cooling gas nozzles 8A', 8B' are receded at the time of a waiting state in order not to interfere with movement of the wafer boat 3, the cooling gas nozzles 8A', 8B' are moved along arc paths 80 to be in corresponding positions, which are illustrated by dotted circles in the drawing, on the front side of the wafer boat 3 when the wafer boat 3 is unloaded from the vertical furnace 2. The cooling gas nozzles 8A', 8B' located on the front side of the wafer boat 3, blow the cooling gas to the wafer boat 3. After the wafer boat 3 and the wafers W are cooled, the cooling nozzles gas nozzles 8A', 8B' go back to the waiting position, and the wafer boat 3 is transferred from the unload position.

Figure 12:
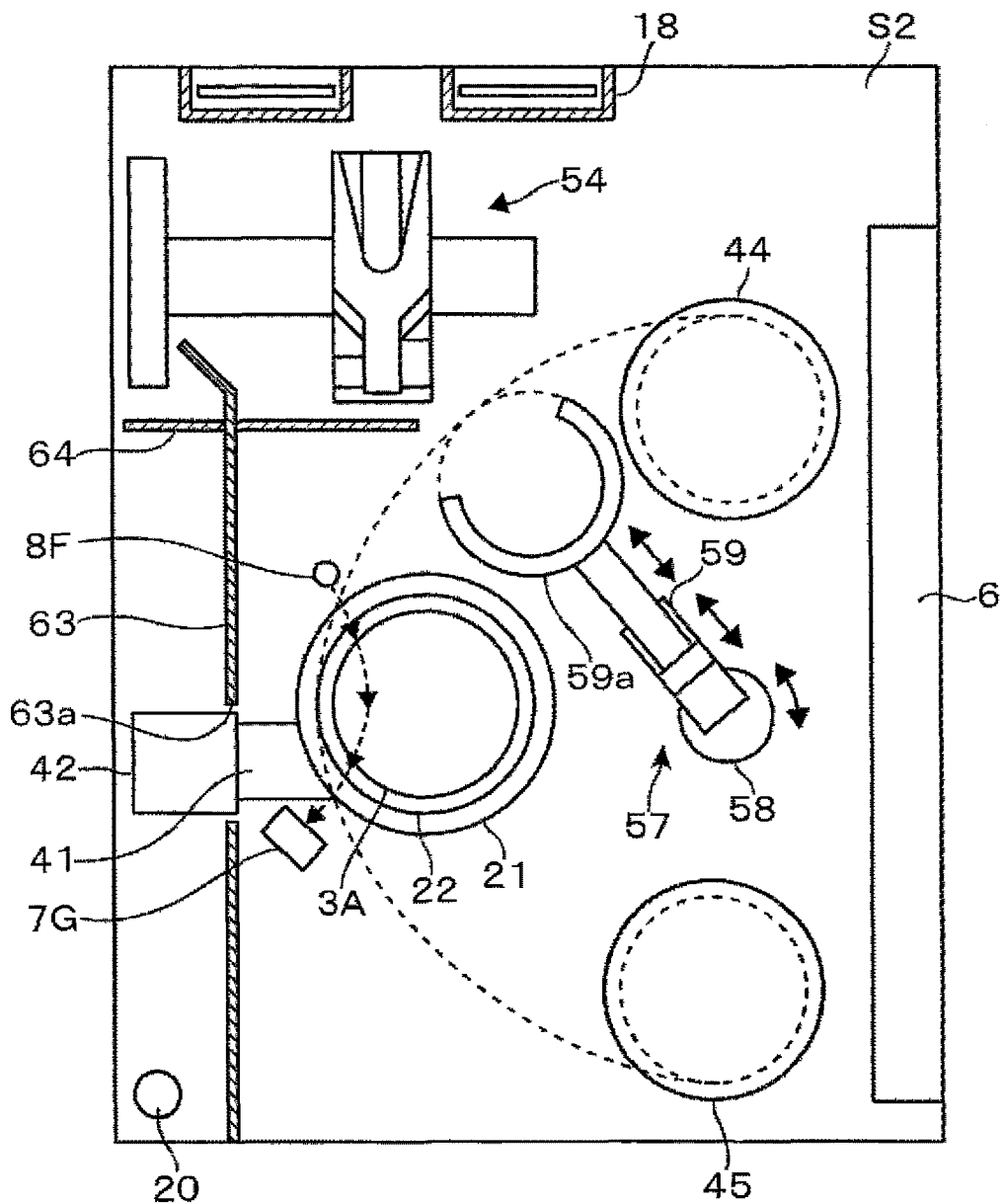
FIG. 12 is a schematic plan view that illustrates another arrangement of the evacuation duct and the cooling gas nozzle in a vertical thermal treatment apparatus according to an embodiment.

In addition, a wafer boat transfer mechanism 57 shown in FIG. 12 may be used instead of the wafer boat transfer mechanism 5, in other embodiments. The wafer boat transfer mechanism 57 includes an arm 59a that can move forward and backward and arranged on a base member 59 that can move upward and downward and rotate around a vertical axis by a driving mechanism 58. The arm 59a surrounds the supporting portion 34 of the wafer boat 3. On the other hand, the thermal insulating member 22 of the boat elevator 41, the first stage 44, and the second stage 45 are arranged along a circumference of a circle having its center at the center of the driving mechanism 58. In addition, the arm 59a supports the supporting member 34 when the arm 59a moves forward so that a substantial C-shaped pick of the arm 59a surrounds the supporting member 34 and the arm 59a is brought upward. Next, the base member 59 rotates so that the arm 59a holds the supporting member 34 and thus the wafer boat 3 above the destination stage (44 or 45). Then, the arm 59a is brought downward by lowering the base member 59 and moves backward, so that the wafer boat 3 is placed on the destination stage. In such a manner, the wafer boat 3 is transferred between the first stage 44 and the second stage 45.

Even in this example, an evacuation duct 7G is arranged near the wafer boat 3A at the unload position in the loading area S2 where the substantial horizontal gas flow is created, and a cooling gas nozzle 8F is arranged near the wafer boat 3A at the unload position and between the evacuation duct 7G and the wafer boat transfer mechanism 58. With these arrangement, the cooling gas from the cooling gas nozzle 8F flows through the wafer boat 3A and then is evacuated from the evacuation duct 7G.

Incidentally, because the heat of the wafer boat 3 and the wafers W can be removed even when only the evacuation ducts 7B, 7C (or 7D, 7E, 7G) are provided near the wafer boat 3 at the unload position in the above embodiment (or its alterations), the wafers W can be cooled in a relatively short period of time, reducing temperature differences between the wafers W. Therefore, the cooling gas nozzles 8A, 8B (or 8A', 8B', 8D, 8F) are not always necessary.

In addition, the evacuation holes 71 may be arranged in at least an upper area of the evacuation ducts 7B, 7C (or 7D, 7E, 7G), thereby directed toward the upper area of the wafer boat 3 at the unload position. The gas or air surrounding the wafer boat 3 at the unload position is heated by the wafer boat 3 that has been unloaded from the vertical furnace 2 and the wafers W in the wafer boat 3, and thus flows upward. However, the heated gas or air can be evacuated by the evacuation holes 71, and therefore the upward thermal diffusion can be avoided.

In addition, instead of the cooling gas nozzles 8A, 8B (or 8A', 8B', 8D, 8F), plural gas nozzles that horizontally extend and are vertically arranged may be used in order to supply the cooling gas toward the evacuation ducts 7B and/or 7C through the wafer boat 3. Moreover, a tubular member that vertically extends and has gas supplying holes in a vertical direction may be provided.

Moreover, the loading area S2 may be under an inert gas environment. Namely, an inert gas (e.g., $N_2$ gas) can be supplied to the loading area S2 through the filter units 6. In this case, the inert gas evacuated to the ventilation area 25 is not evacuated to the outside of the vertical thermal treatment apparatus, but is circulated to the filter units 6 through the radiator 26 by the first fan 27.

EXAMPLES

A simulation was carried out in order to obtain a temperature distribution around the wafer boat 3 that was unloaded from the vertical furnace 2. In this simulation, it was assumed that the wafer boat 3, which has been unloaded from the vertical furnace 2, was placed within a chassis 92 having a size of 1800 mm (width)×1800 mm (depth)×1000 mm (height); a temperature of the wafer boat 3 that was unloaded from the vertical furnace 2 and located at the unload position was 500° C.; and the wafer boat 3 had a size that can hold 100 wafers, each of which has a diameter of 300 mm.

Gas Temperature

REFERENCE EXAMPLE

Figure 13:
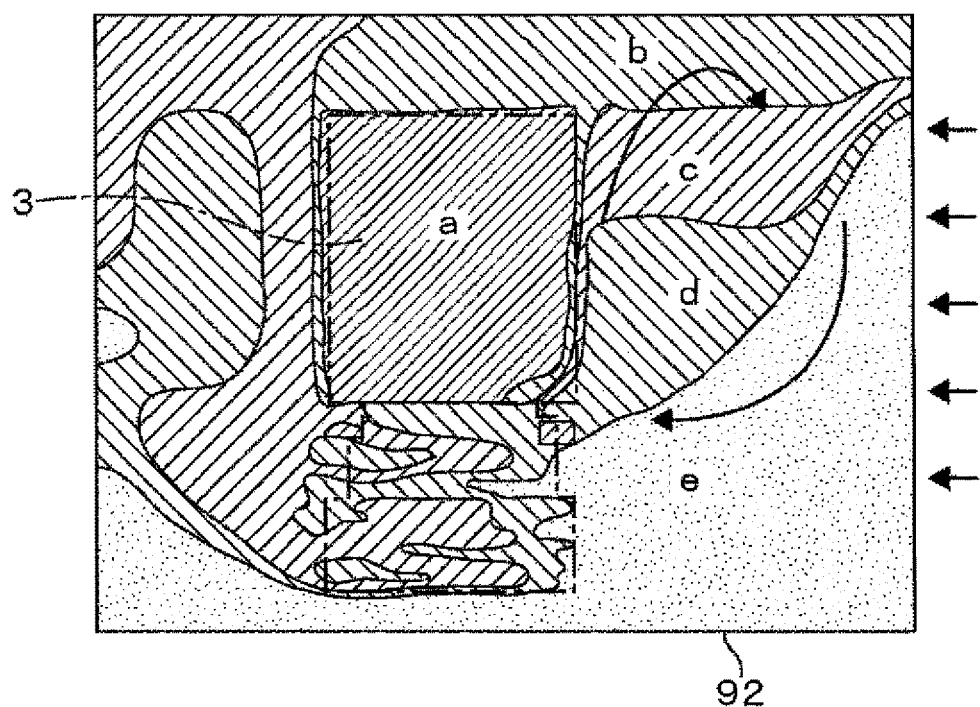
FIG. 13 illustrates a result of a simulation carried out about a temperature distribution with a gas (and/or air)

First, a simulation was made when the evacuation ducts are not arranged near the wafer boat 3. The simulation result is shown in FIG. 13, where a reference symbol "a" represents a temperature area of 700° C. or higher; a reference symbol "b" represents a temperature area of 500° C. or higher and lower than 700° C.; a reference symbol "c" represents a temperature area of 300° C. or higher and lower than 500° C.; a reference symbol "d" represents a temperature area of 100° C. or higher and lower than 300° C.; and a reference symbol "e" represents a temperature area of 30° C. or higher and lower than 100° C. In addition, the wafer boat 3 is illustrated by a chain line.

As a result, hot areas a, b, c, and d prevail in an upper region above the wafer boat 3, and a relatively cool gas (and/or air) flows below the areas a, b, c, and d, as shown by arrows in FIG. 13. Namely, when the evacuation ducts are not provided, a hot gas (and/or air) flows upward and thus members arranged at an upper area of the loading area S2 may be heated. In addition, the relatively cool gas cannot reach the hot areas a, b, c, and d, which cannot be efficiently cooled.

Gas Stream Velocity

Example 1

A simulation about a gas stream velocity was carried out using a model where the wafer boat 3, the evacuation ducts 7A to 7C, and the cooling gas nozzle BA, 8B are provided in the loading area S2. In this case, it was assumed that a gas stream flowing from the right hand side of the loading area S2 is created. In addition, it was assumed that the loading area S2 has an X direction length of 1000 mm, a Y direction length of 1800 mm, and a height of 1800 mm; and the wafer boat 3 has a size that can support 100 wafers W, each of which has a diameter of 300 mm. Moreover, a distance d1 between the surface 70 of the evacuation duct 7B and the circumference of the lid member 21 is 15 mm; a distance d2 between the surface 70 of the evacuation duct 7C and the circumference of the lid member 21 is 15 mm; and distances d3 between the cooling gas nozzles BA, 83 and the circumference of the lid member 21 are 15 mm.

Figure 14:
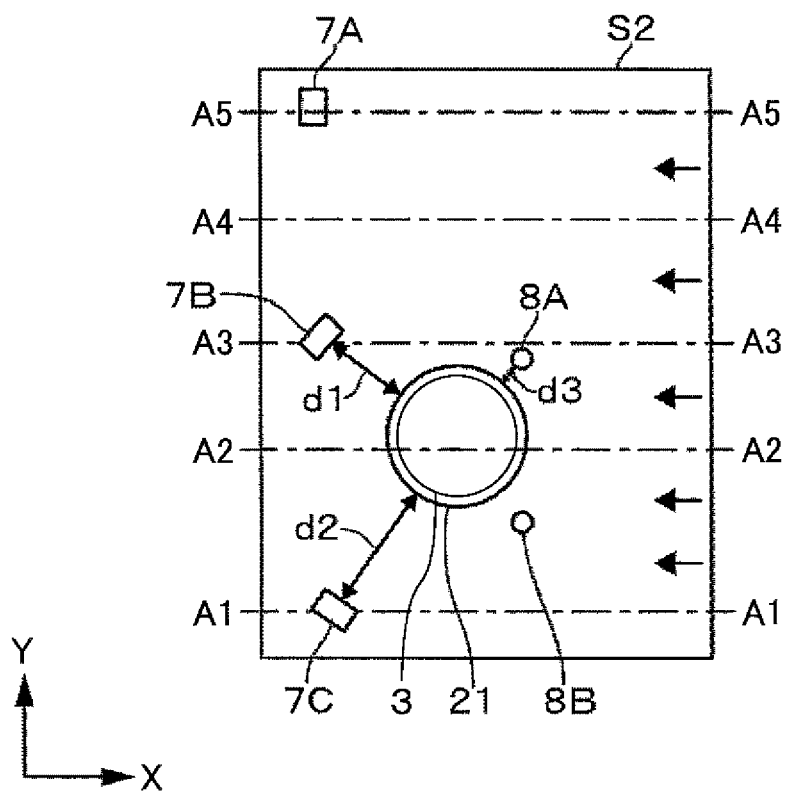
FIG. 14 illustrates a model used in the simulation.

The simulation results of the gas stream velocity obtained at five cross sections taken along A1-A1, A2-A2, A3-A3, A4-A4, and A5-A5 lines in FIG. 14 are shown in FIGS. 15, 16, 17, 18, and 19, respectively. Incidentally, a reference symbol "Va" represents a gas stream velocity of 0.8 m/s or higher; a reference symbol "Vb" represents a gas stream velocity of 0.6 m/s or higher and lower than 0.8 m/s; a reference symbol "Vc" represents a gas stream velocity of 0.4 m/s or higher and lower than 0.6 m/s; and a reference symbol "Vd" represents a gas stream velocity of 0.2 m/s or higher and lower than 0.4 m/s; and a reference symbol "Ve" represents a gas stream velocity of lower than 0.2 m/s.

In addition, as a comparative example, a simulation was carried out using a model where the evacuation ducts 7A to 7C and the cooling gas nozzles 8A, 8B are not provided. In this simulation, it was assumed that the loading area S2 is evacuated through an evacuation hole formed in the left hand side area of the bottom plate of the loading area S2. FIGS. 20, 21, 22, 23, and 24 illustrate simulation results in the same cross sections of A1-A1, A2-A2, A3-A3, A4-A4, and A5-A5, respectively.

Figure 20:
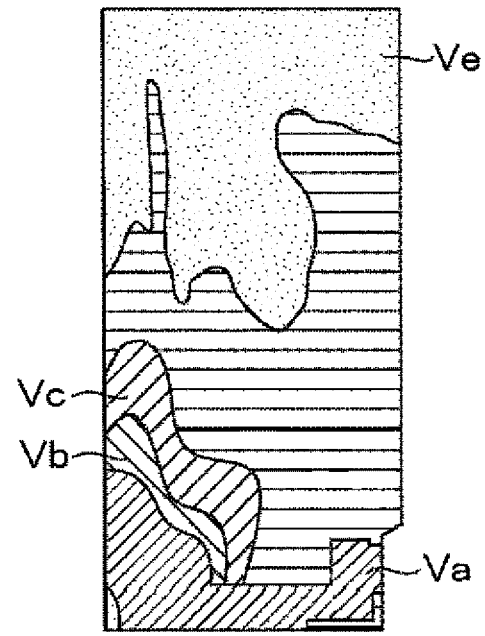
FIG. 20 illustrates a result of another simulation carried out about a gas stream.
Figure 23:
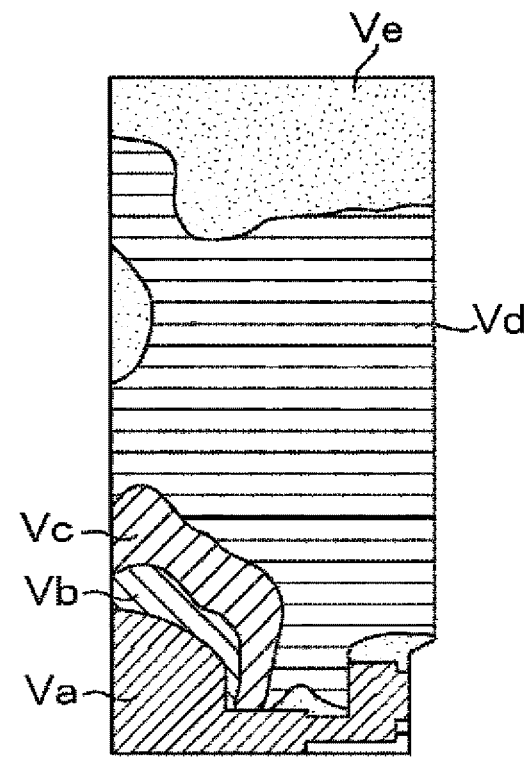
FIG. 23 illustrates a result of another simulation carried out about a gas stream.
Figure 24:
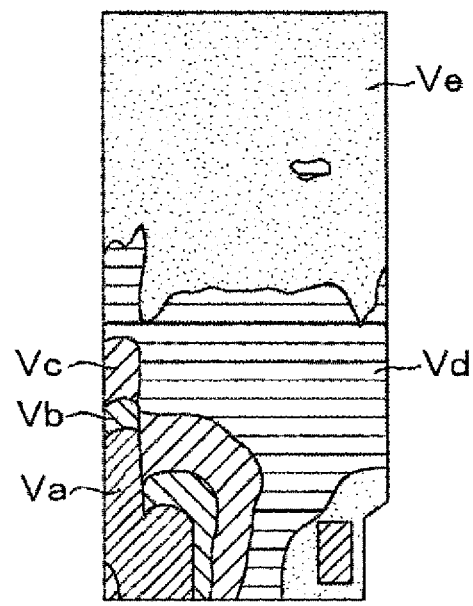
FIG. 24 illustrates a result of another simulation carried out about a gas stream.

Referring to FIGS. 20, 23, 24, there is an area of the gas stream velocity of 0.2 m/s or lower in an upper part of the loading area S2, and a relatively high downward velocity is obtained near the evacuation hole in the bottom plate. Namely, when the evacuation ducts 7A to 7C and the cooling gas nozzles 8A, 8B are not provided in the loading area S2, hot air (and/or gas) having low velocity is stagnant in the upper part of the loading area S2 and a relatively higher velocity is achieved only in the lower part of the loading area S2, which leads to an inefficient cooling of the wafer boat 3 and the wafers W.

Figure 15:
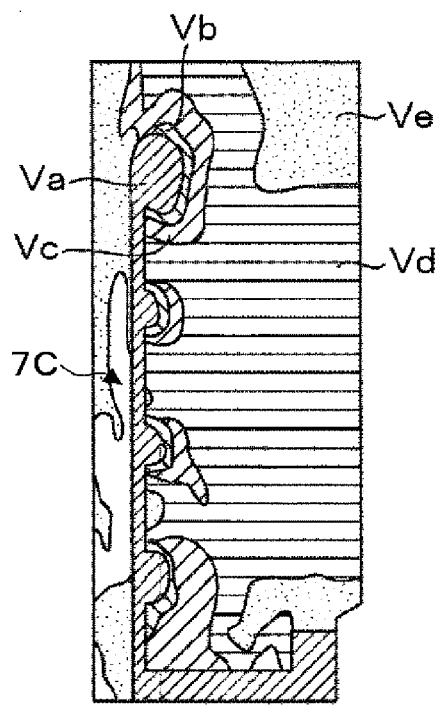
FIG. 15 illustrates a result of a simulation carried out about a gas stream.
Figure 16:
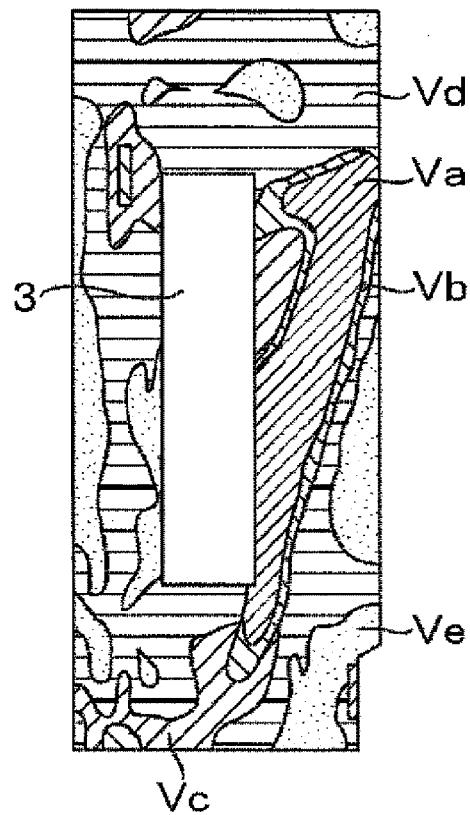
FIG. 16 illustrates a result of another simulation carried out about a gas stream.
Figure 17:
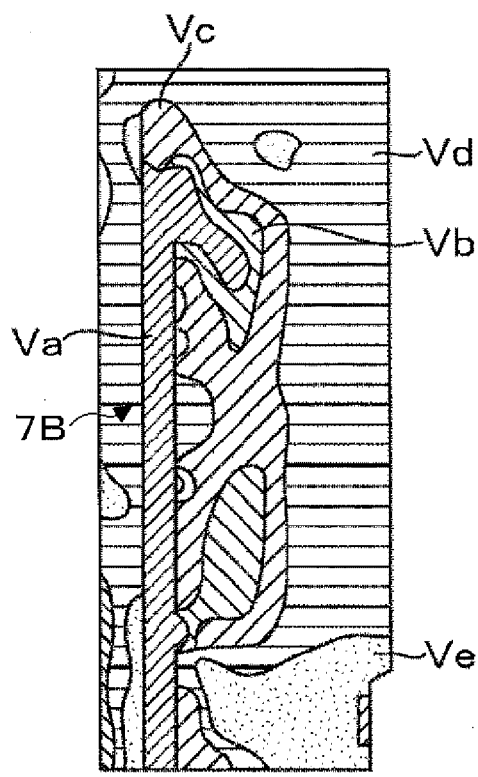
FIG. 17 illustrates a result of another simulation carried out about a gas stream.
Figure 18:
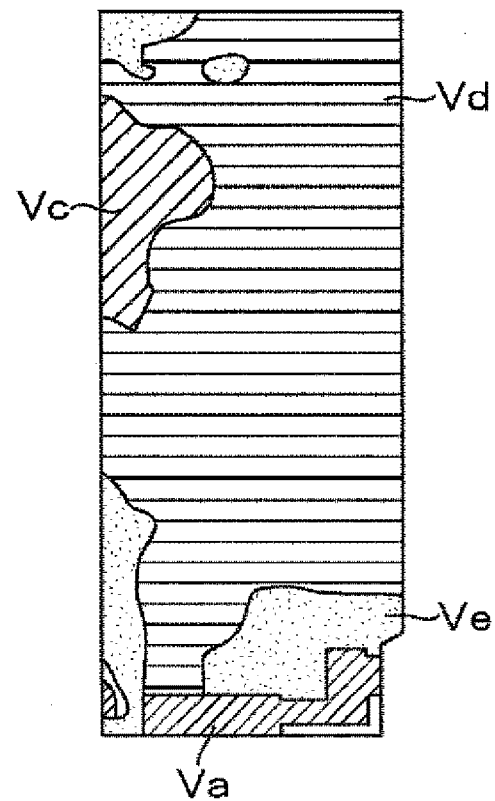
FIG. 18 illustrates a result of another simulation carried out about a gas stream.
Figure 19:
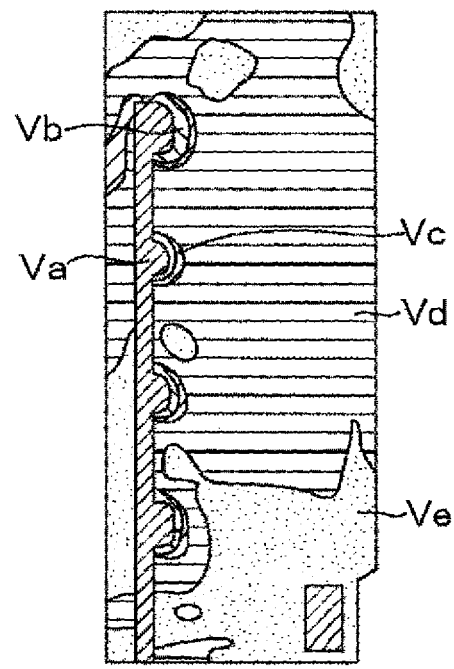
FIG. 19 illustrates a result of another simulation carried out about a gas stream.
Figure 21:
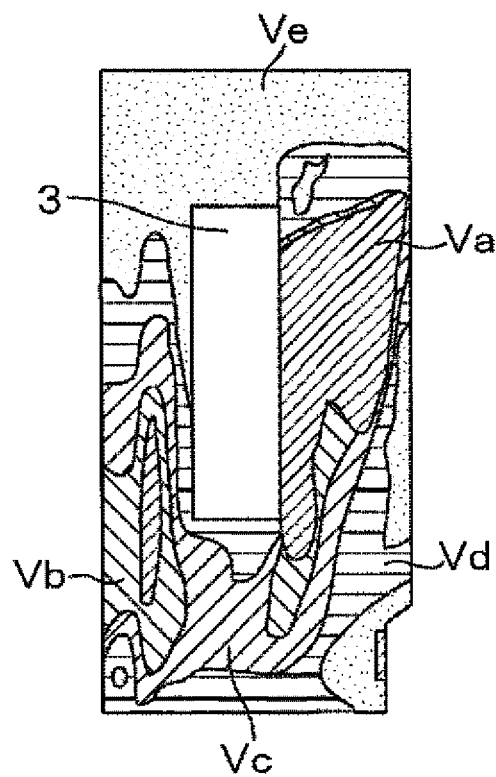
FIG. 21 illustrates a result of another simulation carried out about a gas stream.
Figure 22:
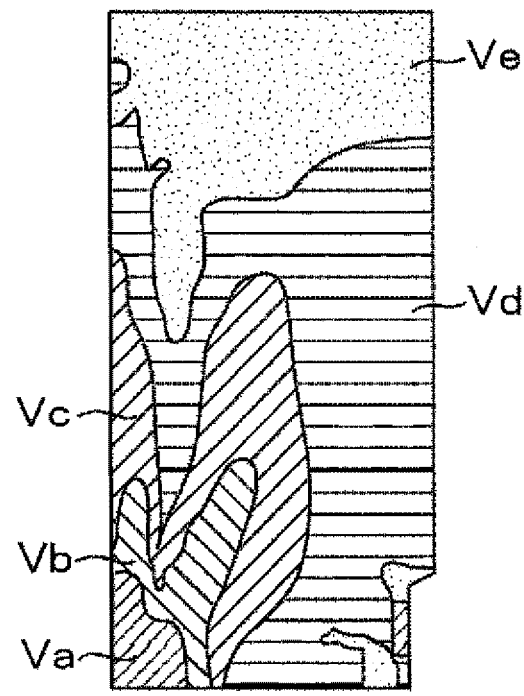
FIG. 22 illustrates a result of another simulation carried out about a gas stream.

On the other hand, the gas stream has a relatively greater velocity near the evacuation holes 71 of the evacuation ducts 7B, 7C in Example 1, which can be easily understood by comparing FIGS. 15-17 with FIGS. 20-22. In addition, the low velocity area Ve, which is observed above the wafer boat 3 in Comparative Example 1 (FIG. 21), is not observed in Example 1 (FIG. 15). Therefore, it can be understood that the gas (and/air) flows into the evacuation holes 71 at a relatively uniform velocity through the area surrounding the wafer boat 3 at the unload position.

Example 2

Actual temperatures of an upper part, a middle part, and a bottom part in an environment above the wafer transfer mechanism 54 were measured after the wafer boat 3 was unloaded from the vertical furnace 2. Here, the upper part, the middle part, and the bottom part are at 1500 mm, 1000 mm, and 500 mm above from the bottom plate 24, respectively. In addition, the wafer boat 3 held 100 wafers W, each of which has a diameter of 300 mm, and the wafers W were thermally treated in the vertical furnace 2 at 700° C. for 60 minutes. In this case, the distance d1 between the surface 70 of the evacuation duct 7B and the circumference of the lid member 21 was 15 mm; the distance d2 between the surface 70 of the evacuation duct 7C and the circumference of the lid member 21 was 15 mm; and distances d3 between the cooling gas nozzles 8A, 83 and the circumference of the lid member 21 were 15 mm, as explained with reference to FIG. 14. In addition, a temperature of the air supplied from the filter units 6 was 20 to 30° C., and a temperature of the cooling gas from the cooling gas nozzles 8A, 8B was 20 to 30° C.

Figure 25:
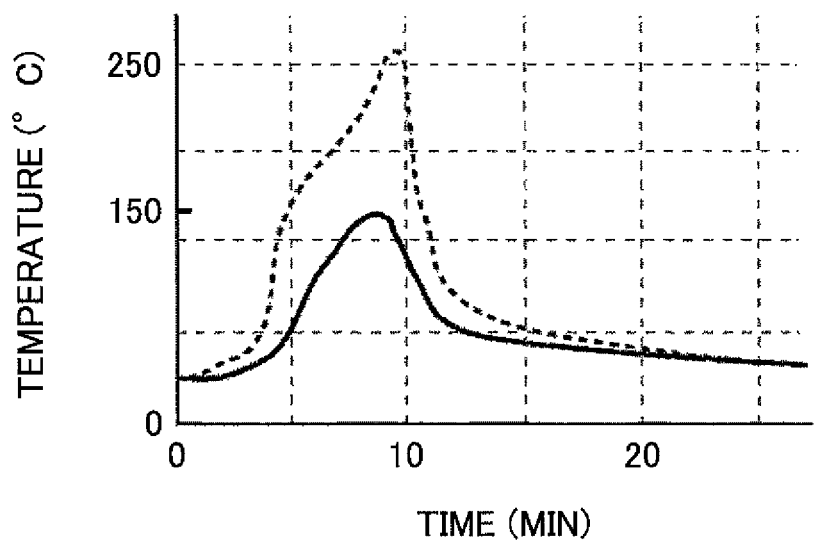
FIG. 25 is a graph that shows temperature changes with time in an area above a wafer boat transfer mechanism after the wafer boat transfer mechanism unloads the wafer boat.
Figure 26:
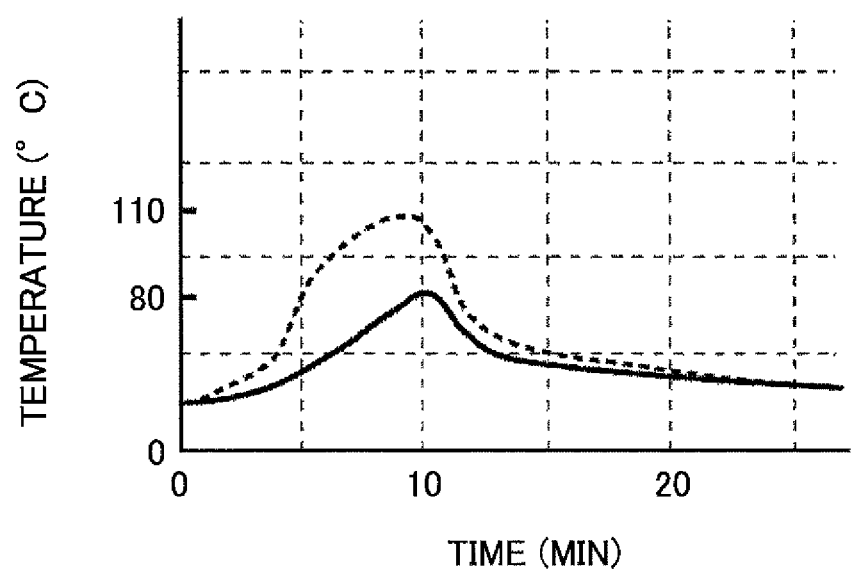
FIG. 26 is a graph that shows temperature changes with time in an area above a wafer boat transfer mechanism after the wafer boat transfer mechanism unloads the wafer boat.
Figure 27:
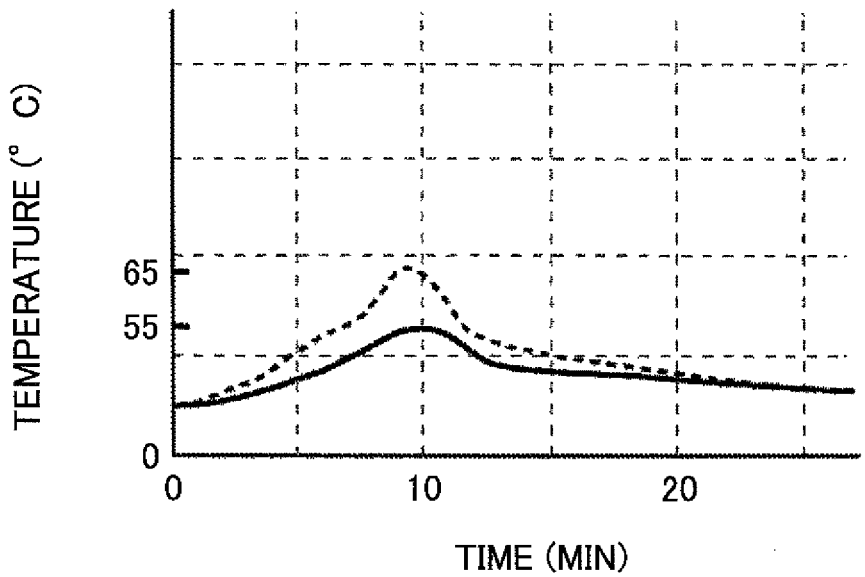
FIG. 27 is a graph that shows temperature changes with time in an area above a wafer boat transfer mechanism after the wafer boat transfer mechanism unloads the wafer boat.

Measurement results obtained at the upper, the middle, and the bottom parts are shown in FIGS. 25, 26, and 27, respectively. In these graphs, a horizontal axis represents time, and a vertical axis represents a temperature. In addition, solid lines indicate the temperatures of the corresponding parts when the evacuation ducts 7A to 7C, the cooling gas nozzles 8A, 8B, and the partition plate 64 are provided in the loading area S2, while dotted curves indicate the temperatures of the corresponding parts when the evacuation ducts 7A to 7C, the cooling gas nozzles 8A, 8B, and the partition plate 64 are not provided in the loading area S2 (referred to as Comparative Example 2). The temperature measurements were repeated plural times and averaged temperatures are shown in the graphs. Moreover, in the graphs of FIGS. 25, 26, and 17, unloading the wafer boat 3 started at zero minutes, and the boat elevator 41 arrived at the unload position at eight minutes.

Referring to FIGS. 25-27, the temperatures at the corresponding parts are lower in Example 2 than in Comparative Example 2. Specifically, the temperature at the upper part is lower by about 100° C. in Example 2 than in Comparative Example 2; the temperature at the middle part is lower by about 30° C. in Example 2 than in Comparative Example 2; and the temperature at the bottom part is lower by about 10° C. in Example 2 than in Comparative Example 2. From these results, it is understood that heat is evacuated by a combination of the evacuation ducts 7A to 70 and the cooling gas nozzles 8A, 8B, and thermal diffusion to the environment above the wafer transfer mechanism 54 is reduced by additionally providing the partition plate 64.

In addition, a temperature difference between the upper part, the middle part, and the bottom part is reduced in Example 2, compared with Comparative Example 2. This may suggest that a temperature difference between the wafers W in the wafer boat 3 that has been unloaded from the vertical furnace 2 is also reduced in Example 2, compared with Comparative Example 2.

Example 3

Figure 28:
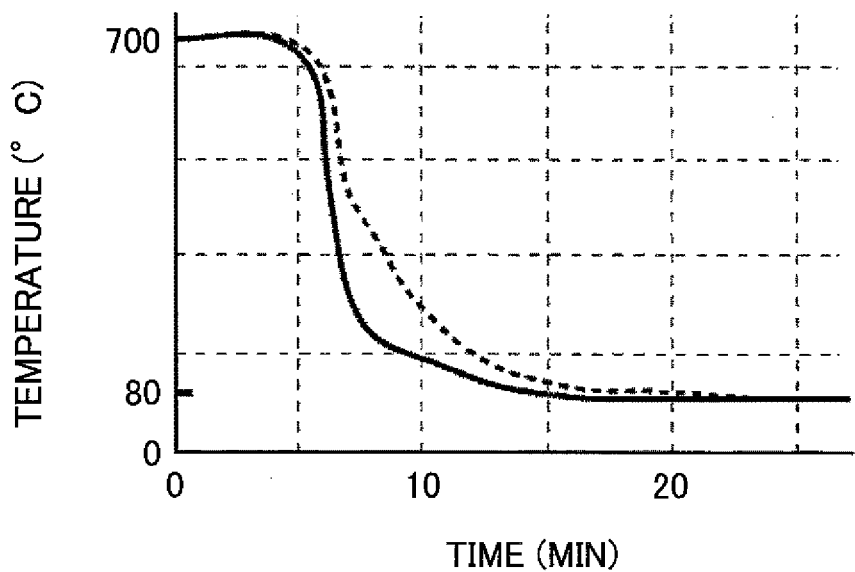
FIG. 28 is a graph that illustrates changes of wafer temperature with time, after the wafer boat is unloaded.

In this example, temperatures of the wafers W in the wafer boat 3 were measured. Specifically, the plural wafers W located at different positions in the wafer boat 3 were measured, and temperatures obtained by averaging the measured temperatures were plotted in FIG. 28. In FIG. 28, solid curves indicate the averaged temperatures when the evacuation ducts 7A to 7C, the cooling gas nozzles 8A, 8B, and the partition plate 64 are provided in the loading area S2, while dotted curves indicate the temperatures of the corresponding parts when the evacuation ducts 7A to 7C, the cooling gas nozzles 8A, 8B, and the partition plate 64 are not provided in the loading area S2 (referred to as Comparative Example 3). In FIG. 28, unloading the wafer boat 3 started at zero minutes, and the boat elevator 41 arrived at the unload position at eight minutes.

Referring to FIG. 28, a period of time required to cool the wafers W in the wafer boat 3 to 80° C. is reduced by about 3 minutes in Example 3 than in Comparative Example 3, from which an advantage of the present embodiment can be understood.

Example 4

Figure 29:
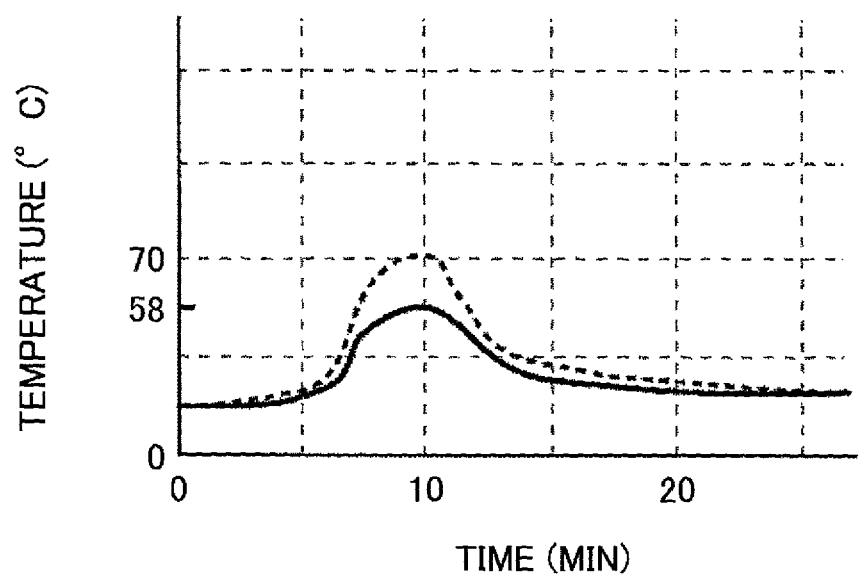
FIG. 29 is a graph that illustrates changes of wafer elevator temperature with time, after the wafer boat is unloaded.

A temperature of the Cableveyor of the boat elevator 41 was measured for a case where the evacuation ducts 7B, 7C, the cooling gas nozzle BA, 8B, and the partition plate 64 are provided in the loading area S2 (Example 4), and for a case where the evacuation ducts 75, 7C, the cooling gas nozzle 8A, 8B, and the partition plate 64 are not provided in the loading area S2 (Comparative Example 4). FIG. 29 illustrates a result of Example 4 with a solid curve and a result of Comparative Example 4 with a dotted curve. In FIG. 29, a horizontal axis represents time, and a vertical axis represents a temperature. In addition, unloading the wafer boat 3 started at zero minutes.

Referring to FIG. 29, the highest temperature of the Cableveyor is lower by about 12° C. in Example 4 than in Comparative Example 4. It is understood from this observation that thermal diffusion toward the moving mechanism 42 of the boat elevator 41 is suppressed by the evacuation ducts 7B and 7C and the cooling gas nozzles 8A, 8B. Therefore, the cables and/or the Cableveyor are prevented from being heated when the wafer boat 3 is unloaded from the vertical furnace 2, and thus problems of thermal deformation of and/or degassing from the cables and/or the Cableveyor are not caused.

Incidentally, while the evacuation ducts 7B, 7C, the cooling gas nozzle 8A, 8B, and the partition plate 64 are provided in Examples 1 through 4, it has been confirmed by the inventors of the present invention that the evacuation ducts 7B, 7C, which are arranged near the wafer boat 3 at the unload position, can evacuate the environment heated by the wafer boat 3, thereby reducing thermal diffusion and thermal convection. In addition, it has been confirmed the evacuation ducts 7B, 7C can evacuate the gas and/or air around the wafer boat 3 at substantially the same velocities at various levels along the longitudinal direction of the wafer boat 3. Therefore, the evacuation ducts 7B, 70 contribute, to a greater extent, to cooling the wafer boat 3 and the wafers W, thereby to reduce a period of time required to cool the wafer boat 3 and the wafers W and to reduce temperature difference between the wafers W.

While the present invention has been described in reference to the foregoing embodiments, the present invention is not limited to the disclosed embodiments, but may be modified or altered within the scope of the accompanying claims.

What is claimed is:

1. A thermal treatment apparatus for thermally treating a plurality of wafers in a furnace in a state in which the plurality of wafers are stacked in a substrate holding member in the form of shelves, the thermal treatment apparatus comprising:
   a loading area located below the furnace;
   a substrate holding member elevating mechanism that carries the substrate holding member between a load position within the furnace and an unload position within the loading area, the substrate holding member elevating mechanism is arranged in the loading area;
   a gas stream creating mechanism that creates, in the loading area, a substantially horizontal gas stream that flows in a first direction from a front side of the loading area toward a rear side of the loading area opposite to the front side such that the substantially horizontal gas stream flows into a first evacuation opening provided in the loading area, the substrate holding member being located in a path of the substantially horizontal gas stream flowing in the first direction when the substrate holding member is in the unload position such that the substrate holding member in the unload position is contacted by the substantially horizontal gas stream;

a substrate holding member transfer mechanism that transfers the substrate holding member when the substrate holding member is in the unload position;

a thermal evacuation part that is provided in the loading area between the first evacuation opening and an upstream end of the substrate holding member with regard to the flow of the substantially horizontal gas stream flowing in the first direction when the substrate holding member is in the unload position, the thermal evacuation part including a second evacuation opening that is arranged to oppose at least an upper part of the substrate holding member when the substrate holding member is in the unload position and evacuates an environment around the substrate holding member located at the unload position while reducing an upward thermal diffusion and turbulence of the substantially horizontal gas stream, said thermal treatment apparatus further comprising a chamber provided underneath said substrate holding member in communication with said thermal evacuation part such that contents of said environment evacuated by said thermal evacuation part flows into said chamber as a first exhaust gas, said chamber having a chamber wall provided with said first evacuation opening therein such that said substantially horizontal gas stream that has flown into said first evacuation opening flows into said chamber as a second exhaust gas, said chamber directly discharges a part of said first and second exhaust gases to an exterior of the thermal treatment apparatus, said thermal evacuation part and said first evacuation opening being provided on said chamber wall at respective, mutually separated locations, Wherein the substrate holding member transfer mechanism is provided closer to the front end of the loading area than the substrate holding member in the state the substrate holding member is located at the unload position, and wherein the thermal treatment apparatus further comprises a cooling gas supplying part provided between the thermal evacuation part and substrate holding member transfer mechanism, the cooling gas supplying part supplying a cooling gas to the substrate holding member located at the unload position.

2. The thermal treatment apparatus according to claim 1, wherein the thermal evacuation part includes a tubular member that vertically extends and wherein the second evacuation opening is formed in the tubular member.

3. The thermal treatment apparatus according to claim 1, wherein the cooling gas supplying part includes a cooling gas nozzle that vertically extends, the cooling gas nozzle including supplying openings along a longitudinal direction of the cooling gas nozzle.

4. The thermal treatment apparatus according to claim 1, wherein the cooling gas supplying part includes a first cooling gas supplying part and a second cooling gas supplying part, wherein the first and second cooling gas supplying parts are arranged respectively at a right side and a left side of the substrate holding member when viewed in the direction of the substantially horizontal gas stream flowing in the first direction and contacting the substrate holding member in a state in which the substrate holding member is in the unload position.

5. A thermal treatment method for thermally treating a plurality of wafers in a furnace in a state in which the plurality of wafers are stacked in the form of shelves in a substrate holding member, the thermal treatment method comprising steps of:

creating a substantially horizontal gas stream in a loading area located below the furnace such that the gas stream flows in a first direction from a front side of the loading area toward a rear side of the loading area opposite to the front side and such that the gas stream flows into a first evacuation opening provided in the loading area;

transferring the substrate holding member to an unload position below the furnace in the loading area by using a substrate holding member transfer mechanism;

carrying the substrate holding member from the unload position to a load position within the furnace by using the substrate holding member elevating mechanism and applying a thermal treatment to the plurality of wafers in the furnace in the state the plurality of wafers are stacked in the substrate holding member in the form of shelves;

carrying, after applying the thermal treatment, the substrate holding member from the load position to the unload position in the loading area by using the substrate holding member elevating mechanism such that the substantially horizontal gas stream flowing in the loading area in the first direction from the front side of the loading area contacts the substrate holding member in the unload position; and evacuating an environment around the substrate holding member in a state in which the substrate holding member is located at the unload position by using a thermal evacuation part provided to the loading area between the first evacuation opening and an upstream end of the substrate holding member with regard to the flow of the substantially horizontal gas stream flowing in the first direction and contacting the substrate holding member in the state the substrate holding member is located at the unload position in the loading area, the thermal evacuation part includes a second evacuation opening that is arranged to oppose at least an upper part of the substrate holding member in the state in which the substrate holding member is located at the unload position and evacuates the environment around the substrate holding member in the state the substrate holding member is in the unload position by the second evacuation opening provided to the loading area while reducing an upward thermal diffusion and turbulence of the substantially horizontal gas stream, said thermal treatment apparatus further comprising a chamber provided underneath said substrate holding member in communication with said thermal evacuation part, said step of evacuating evacuates the environment such that contents of said environment flows into said chamber as a first exhaust gas, said chamber having a chamber wall provided with said first evacuation opening therein such that said substantially horizontal gas stream that has flown into said first evacuation opening flows into said chamber as a second exhaust gas, said chamber directly discharges a part of said first and second exhaust gases to an exterior of the thermal treatment apparatus, said thermal evacuation part and said first evacuation opening being provided on said chamber wall at respective, mutually separated locations, Wherein the substrate holding member transfer mechanism is provided at an upstream side of the substrate holding member located at the unload position with regard to a direction of the substantially horizontal gas stream flowing in the first direction, and wherein the thermal treatment method further comprises a step of supplying a cooling gas to the substrate holding member located at the unload position by using a cooling gas supplying part provided between the thermal evacuation part and the substrate holding member transfer mechanism.

6. The thermal treatment method according to claim 5, wherein, in the step of evacuating the environment around the substrate holding member, the environment around the substrate holding member is evacuated by using the thermal evacuation part that includes a tubular member that vertically extends, and second evacuation openings provided in the tubular member in the state in which the substrate holding member is in the unload position.

7. The thermal treatment apparatus as claimed in claim 1, wherein said chamber includes a fan that discharges the first and second exhaust gases to the exterior of the thermal treatment apparatus.

8. The thermal treatment apparatus as claimed in claim 1, wherein said chamber circulates another part of said first and second exhaust gases to said gas stream creating mechanism.

9. The thermal treatment method as claimed in claim 5, wherein said chamber circulates another part of said first and second exhaust gases to said gas stream creating mechanism.

* * * * *